(12) United States Patent
Clark et al.

(10) Patent No.: US 10,332,857 B2
(45) Date of Patent: Jun. 25, 2019

(54) RARE EARTH PNICTIDES FOR STRAIN MANAGEMENT

(71) Applicant: IQE, plc, St. Mellons, Cardiff (GB)

(72) Inventors: Andrew Clark, Mountain View, CA (US); Rytis Dargis, Oak Ridge, NC (US); Michael Lebby, San Francisco, CA (US); Rodney Pelzel, Emmaus, PA (US)

(73) Assignee: IQE plc, St. Mellons, Cardiff (GB)

( * ) Notice: Subject to any disclaimer, the term of this patent is extended or adjusted under 35 U.S.C. 154(b) by 0 days.

(21) Appl. No.: 15/612,355

(22) Filed: Jun. 2, 2017

(65) Prior Publication Data

US 2017/0353002 A1   Dec. 7, 2017

Related U.S. Application Data

(60) Provisional application No. 62/385,744, filed on Sep. 9, 2016, provisional application No. 62/344,439, filed on Jun. 2, 2016.

(51) Int. Cl.
  *H01L 21/00*   (2006.01)
  *H01L 21/20*   (2006.01)
  (Continued)

(52) U.S. Cl.
  CPC .......... *H01L 24/32* (2013.01); *H01L 21/0251* (2013.01); *H01L 21/02381* (2013.01);
  (Continued)

(58) Field of Classification Search
  CPC ... H01L 24/32; H01L 24/94; H01L 21/02381; H01L 21/02483; H01L 21/02502;
  (Continued)

(56) References Cited

U.S. PATENT DOCUMENTS 9,142,406 B1   9/2015   Dargis et al.
10,075,143 B2 *   9/2018   Pelzel ..................... H01L 23/66
(Continued)

FOREIGN PATENT DOCUMENTS

EP   1595280   12/2006
WO   WO 2005/065402   7/2005

OTHER PUBLICATIONS

Hall et al., "Growth of ScN Epitaxial Films by Plasma-Assisted Molecular Beam Epitaxy", Journal of Crystal Growth, vol. 311, No. 7, Mar. 15, 2009, pp. 2054-2057.

(Continued)

*Primary Examiner* — Seahvosh Nikmanesh
(74) *Attorney, Agent, or Firm* — Haley Guiliano LLP; Jeffrey H. Ingerman

(57) ABSTRACT

Systems and methods described herein may include a first semiconductor layer with a first lattice constant, a rare earth pnictide buffer epitaxially grown over the first semiconductor, wherein a first region of the rare earth pnictide buffer adjacent to the first semiconductor has a net strain that is less than 1%, a second semiconductor layer epitaxially grown over the rare earth pnictide buffer, wherein a second region of the rare earth pnictide buffer adjacent to the second semiconductor has a net strain that is a desired strain, and wherein the rare earth pnictide buffer may comprise one or more rare earth elements and one or more Group V elements. In some examples, the desired strain is approximately zero.

19 Claims, 16 Drawing Sheets

(51) Int. Cl.
    *H01S 3/16*     (2006.01)
    *H01S 3/09*     (2006.01)
    *H01S 5/30*     (2006.01)
    *H01L 23/00*     (2006.01)
    *H01L 21/02*     (2006.01)

(52) U.S. Cl.
    CPC .. *H01L 21/02439* (2013.01); *H01L 21/02483* (2013.01); *H01L 21/02502* (2013.01); *H01L 21/02505* (2013.01); *H01L 21/02543* (2013.01); *H01L 21/02546* (2013.01); *H01L 24/94* (2013.01); *H01S 3/09* (2013.01); *H01S 3/1603* (2013.01); *H01S 3/1605* (2013.01); *H01S 3/1611* (2013.01); *H01S 3/1628* (2013.01); *H01S 3/1655* (2013.01); *H01S 5/3031* (2013.01); *H01L 21/0262* (2013.01); *H01L 2224/291* (2013.01); *H01L 2224/29082* (2013.01); *H01L 2224/29193* (2013.01); *H01L 2224/32145* (2013.01); *H01L 2924/01033* (2013.01); *H01L 2924/01064* (2013.01); *H01L 2924/01068* (2013.01); *H01L 2924/0505* (2013.01); *H01L 2924/0525* (2013.01); *H01L 2924/0545* (2013.01); *H01L 2924/10253* (2013.01); *H01L 2924/10335* (2013.01); *H01S 5/30* (2013.01); *H01S 2301/17* (2013.01)

(58) Field of Classification Search
    CPC ........... H01L 21/02505; H01L 21/0251; H01L 21/02543; H01L 21/02546
    See application file for complete search history.

(56) References Cited

U.S. PATENT DOCUMENTS

2015/0203990 A1    7/2015   Dargis et al.
2016/0322224 A1*  11/2016  Wright ................... C01G 28/00

OTHER PUBLICATIONS

International Search Report and Written Opinion in Application No. PCT/US2017/035744, dated Jun. 2, 2016 (9 pages).

* cited by examiner

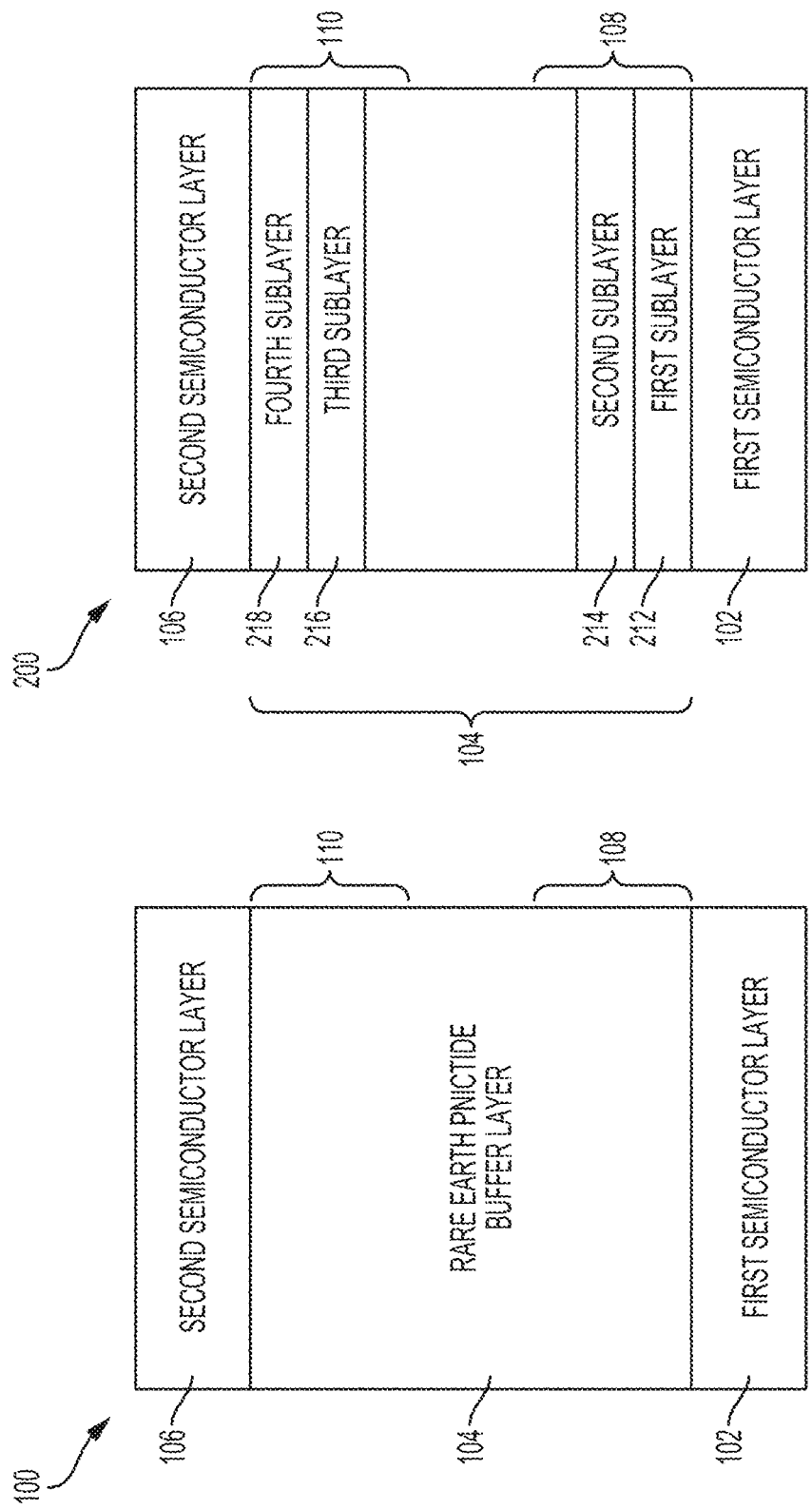

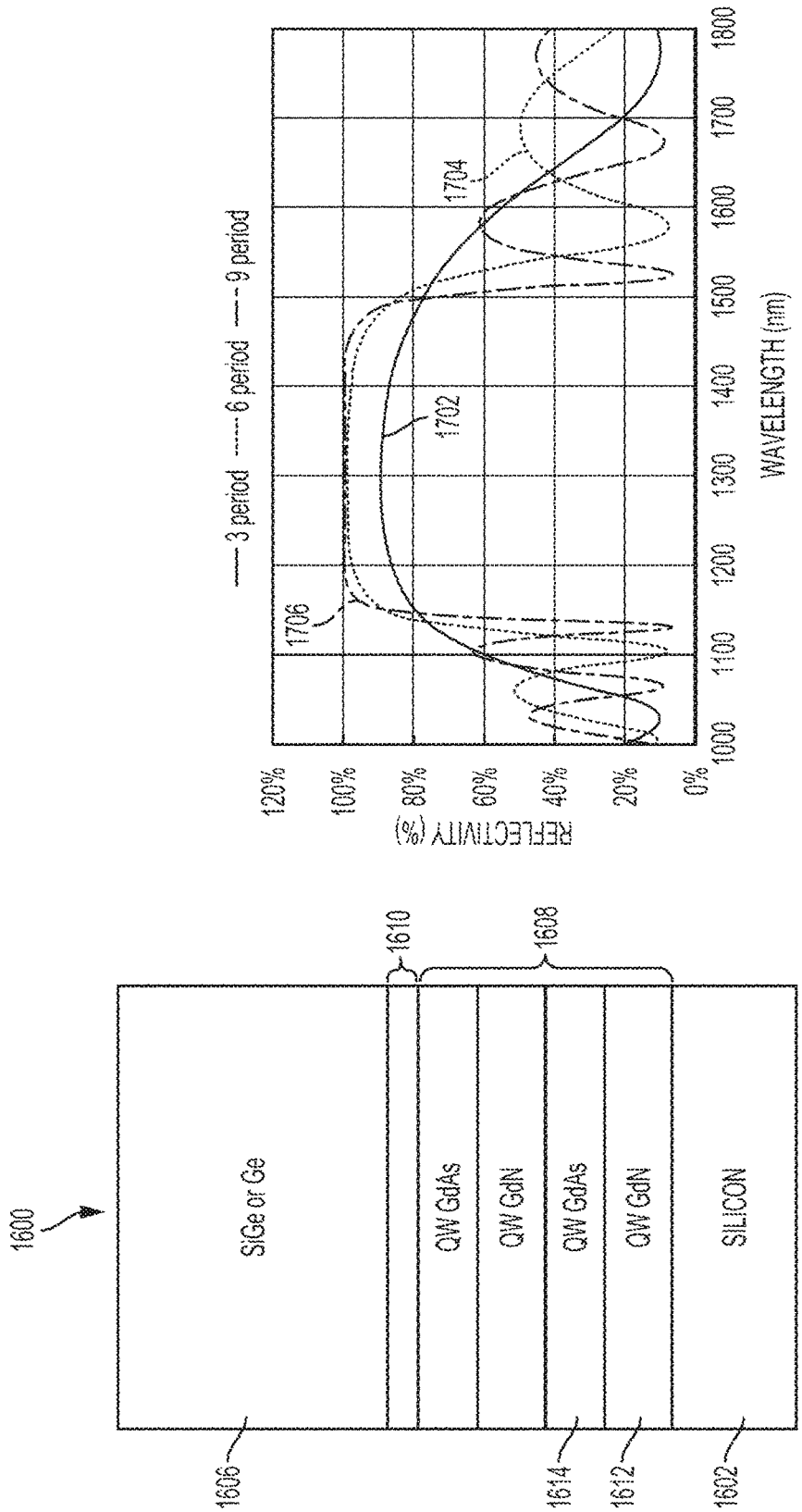

RARE EARTH PNICTIDES FOR STRAIN MANAGEMENT

CROSS-REFERENCE TO RELATED APPLICATIONS

This application claims priority to U.S. Provisional Application Ser. No. 62/344,439, filed Jun. 2, 2016, and U.S. Provisional Application Ser. No. 62/385,744, filed Sep. 9, 2016, each of which is hereby incorporated herein by reference in its entirety. This application is related to co-pending PCT Application No. PCT/US2017/035744, filed Jun. 2, 2017, which is hereby incorporated herein by reference in its entirety.

BACKGROUND

Photonic and/or electronic devices are often made of III-V materials, but III-V substrates are expensive. Silicon substrates are relatively inexpensive, but III-V materials cannot be grown directly on them. Even when buffer layers are used, the III-V materials often contain dislocations and defects due to the lattice mismatch between the III-V materials and silicon, impairing performance of the photonic and/or electronic devices.

SUMMARY

Systems and methods are described herein for the use of rare earth based pnictide alloys to grow buffers between a first semiconductor layer with a first lattice constant and a second semiconductor material. The systems and methods described further include dividing the buffers into sublayers of varying lattice constants that gradually modify the lattice constant of the layer structure from the lattice constant of the first semiconductor to the lattice constant of the semiconductor in order to maintain stability.

Systems and methods described herein may include a first semiconductor layer with a first lattice constant, a rare earth pnictide buffer epitaxially grown over the first semiconductor, wherein a first region of the rare earth pnictide buffer adjacent to the first semiconductor has a first net strain that is less than 1%, a second semiconductor layer epitaxially grown over the rare earth pnictide buffer, wherein a second region of the rare earth pnictide buffer adjacent to the second semiconductor has a second net strain that is a desired strain, and wherein the rare earth pnictide buffer may comprise one or more rare earth elements and one or more Group V elements. In some examples, the desired strain is less than 1%.

The first region of the rare earth pnictide buffer may comprise a first sublayer comprising a first rare earth pnictide alloy and having a first thickness and a second sublayer comprising a second rare earth pnictide alloy and having a second thickness, wherein the ratio of the first thickness to the second thickness results in the first net strain of the first region being less than 1%. In some examples, the second region of the rare earth pnictide buffer comprises a third sublayer comprising a third rare earth pnictide alloy and having a third thickness and a fourth sublayer comprising the second rare earth pnictide alloy and having the second thickness, wherein the ratio of the third thickness to the second thickness results in the second net strain of the second region being the desired strain. In some examples, the desired strain is between 1% and 3%.

In some examples, the first, second, and third rare earth pnictide alloys may comprise a common rare earth element. In some examples, the first rare earth pnictide alloy comprises ErN, the second rare earth pnictide alloy comprises ErP, and the third rare earth pnictide alloy comprises ErAs. In some examples, the first rare earth pnictide alloy comprises GdN, the second rare earth pnictide alloy comprises GdAs, and the third rare earth pnictide alloy comprises GdN.

In some examples, the first rare earth pnictide alloy comprises ErN, the second rare earth pnictide alloy comprises ErP, and the third rare earth pnictide alloy comprises GdP.

In some examples, the first semiconductor comprises Si and the second semiconductor comprises of $Si_{1-x}Ge_x$ ($0<x\leq1$). In some examples, the layer structure of claim 1, wherein the first semiconductor comprises Si and the second semiconductor comprises one or more of $In_xGa_{1-x}As_yP_{1-y}$, $Al_xGa_{1-x}As$, and $Ga_{1-x-y}Al_xIn_ySb_{1-p}As_p$, and $Ga_xIn_{1-x}N_yAs_{1-y}$($0\leq x,y$, and $p\leq1$).

The first region of the rare earth pnictide buffer may comprise a first rare earth pnictide alloy with elements in first proportions and the second region of the rare earth pnictide buffer may comprise the first rare earth pnictide alloy with elements in second proportions.

The second region of the rare earth pnictide buffer comprises a third rare earth pnictide alloy with elements in third proportions, wherein the third proportions result in the second net strain of the second region being the desired strain. In some examples, the first semiconductor layer is epitaxially grown over a base material and an upper semiconductor layer is epitaxially grown over the second semiconductor layer.

In some examples, a mirror structure comprising the layer structure of claim 1, wherein the second and the third thicknesses are chosen to result in Bragg reflection of light of a desired wavelength.

BRIEF DESCRIPTION OF DRAWINGS

The above and other features of the present disclosure will be more apparent upon consideration of the following detailed description, taken in conjunction with the accompanying drawings in which:

FIG. 1 depicts a layer structure with a second semiconductor layer over a rare earth pnictide layer, according to an illustrative embodiment;

FIG. 2 depicts a layer structure that is a specific example of the layer structure shown in FIG. 1, according to an illustrative embodiment;

FIG. 16 depicts a layer structure that comprises a distributed Bragg reflector structure for photonic device applications, according to an illustrative embodiment;

FIG. 17 depicts a graph that shows a collection of wavelengths corresponding to a distributed Bragg reflector for photonic device applications, according to an illustrative embodiment;

DETAILED DESCRIPTION

Figure 3:
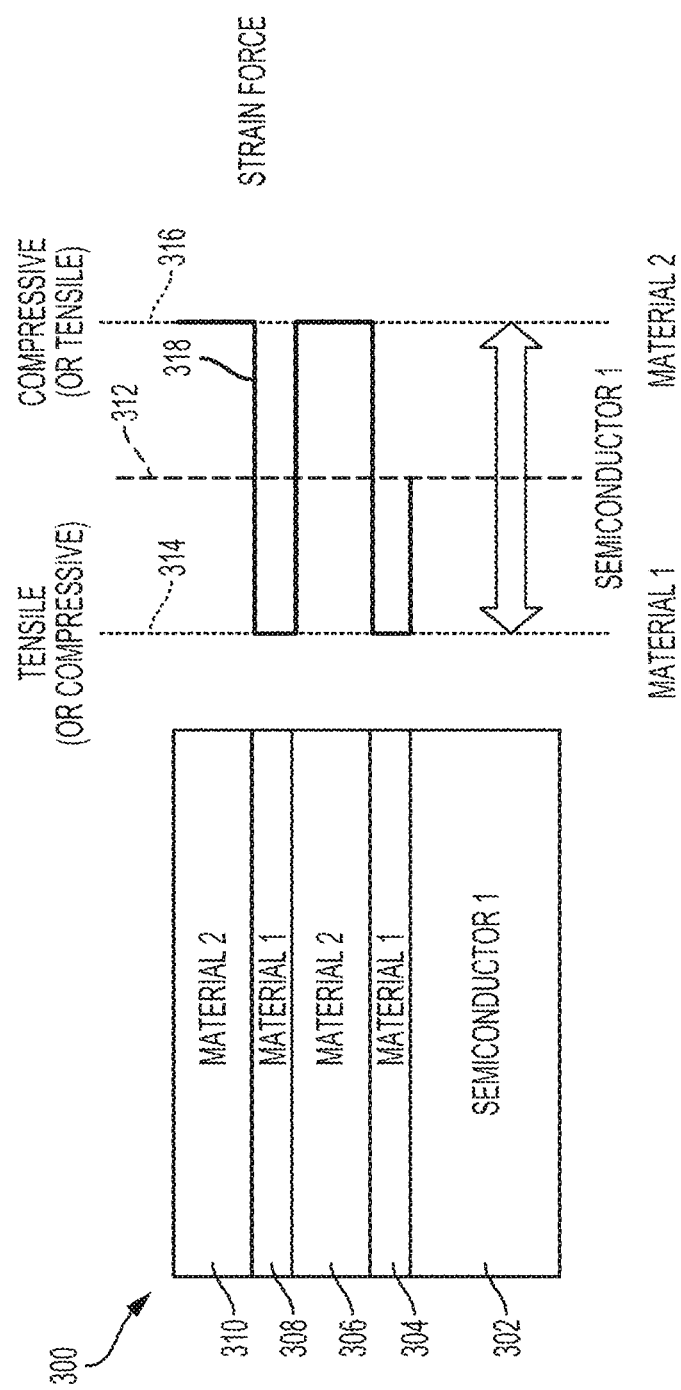
FIG. 3 depicts a layer structure that is a specific example of the layer structure shown in FIG. 1, according to an illustrative embodiment.

In the following description, numerous details are set forth for the purpose of explanation. However, one of ordinary skill in the art will realize that the embodiments described herein may be practiced without the use of these specific details. In other instances, well-known structures and devices are shown in block diagram form so that the description will not be obscured with unnecessary detail.

Rare earth pnictide materials can be used as buffer layers for epitaxial growth of germanium or other semi-conducting materials on silicon substrates. There is a large mismatch between the lattice constants of silicon and germanium or other semi-conducting materials grown over silicon substrates. This creates high levels of defects in the layers. The high levels of defects in the layers may lead to loss of coherence in the layers. The high levels of defects may be avoided if the lattice constant is gradually changed throughout the buffer layers positioned between silicon and germanium. The rare earth pnictide buffer layers can be graded in composition and lattice constant to result in small or no mismatches in lattice constant and high crystal quality throughout the layer structures. The rare earth pnictide layers are used to balance the strain and gradually reduce the lattice mismatch between the structure of the silicon substrate and the germanium or other semi-conducting materials grown on the silicon. The rare earth pnictide layers may also create strain in the germanium or the semi-conducting materials grown on the silicon substrate to enhance the mobility of charge carriers that increases the conductivity of the germanium or the semi-conducting materials. In some embodiments, the rare earth pnictide layers may create strain in the germanium or the semi-conducting materials grown on the silicon substrate to modify the band structure of germanium or semi-conducting materials to increase the efficiency of the emission of photos in such materials.

Rare earth pnictide is a name given to alloys formed from one or more rare earth elements and one or more group V elements. Group V elements include nitrogen (N), phosphorous (P), arsenic (As), antimony (Sb), and bismuth (Bi). Rare earth elements (RE) include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y). In particular, rare earth pnictides including pnictide alloys may use one rare earth (e.g. Sc, Er, Gd, Nd) and 2 of the group V elements (e.g. N, P, As).

FIG. 1 depicts a layer structure 100 that includes a first semiconductor layer 102, a rare earth pnictide buffer layer 104 epitaxially grown over the first semiconductor layer 102, and a second semiconductor layer 106 epitaxially grown over the rare earth pnictide buffer layer 104. The first semiconductor layer 102 may be any semiconductor or insulating layer that provides an epitaxial template for growth of the layer structure 100. The first semiconductor layer 102 is, for example, a silicon substrate with a crystal orientation of <100>. In some embodiments, the first semiconductor layer 102 may be a III-V alloy that includes at least one element from group III and at least one element from group V (such as $Al_xGa_{1-x}As$, $Ga_{1-x-y}Al_xIn_ySb_{1-p}As_p$, and $Ga_xIn_{1-x}N_yAs_{1-y}$ ($0 \leq x$, y, and $p \leq 1$) for example). Alternatively, the first semiconductor layer 102 is a silicon layer over an insulator layer, as in an SOI substrate, or a silicon layer epitaxially grown over another layer.

In some embodiments, the rare earth pnictide buffer layer 104 includes at least one rare earth element and at least two group V elements. The rare earth pnictide buffer layer 104 can include a first region 108 adjacent to the first semiconductor layer 102 and a second region 110 adjacent to the second semiconductor layer 106. The first region 108 of the rare earth pnictide buffer 104 has a crystal lattice constant similar to the first semiconductor layer 102 and the second region 110 of the rare earth pnictide buffer layer 104 has a crystal lattice constant similar to the second semiconductor layer 106. In some embodiments, the first group V element has a first concentration in the first region 108 and and a second concentration in the second region 110. The concentration of the first group V element varies across the thickness of the rare earth pnictide buffer layer 104 in a graded, stepwise, linear, sublinear, or superlinear manner from the first concentration at the first region 108 to the second concentration at the second region 110. Additionally, the second group V element has a third concentration in the first region 108 and a fourth concentration in the second region 110. The concentration of the second group V element varies across the thickness of the rare earth pnictide buffer layer 104 in a graded, stepwise, linear, sublinear, or superlinear manner from the third concentration at the first region 108 to the fourth concentration at the second region 110. The first concentration, the second concentration, the third concentration and the fourth concentration may vary from 0% to 100%. In some embodiments, the first region 108 of the rare earth pnictide buffer layer 104 may not contain the second group V element, except for unintentional impurities, and the second region 110 of the rare earth pnictide buffer layer 104 may not contain the first group V element, except for unintentional impurities. The concentration of the first group V element and the second group V element is gradually changed so that the lattice constant varies from that of silicon (or is substantially matched to the lattice constant of silicon) to that of the second semi conductor layer (or is substantially matched to the lattice constant of the second semi conductor layer). Accordingly, the layers 104 and 106 are epitaxially grown over the silicon without introducing extra strain on the layer 102.

In some embodiments, the rare earth pnictide buffer layer 104 includes at least two rare earth elements and at least one group V elements. The rare earth pnictide buffer layer 104 can include a first region 108 adjacent to the first semiconductor layer 102 and a second region 110 adjacent to the second semiconductor layer 106. The first region 108 of the rare earth pnictide buffer 104 has a crystal lattice constant similar to the first semiconductor layer 102 and the second region 119 of the rare earth pnictide buffer layer 104 has a crystal lattice constant similar to second semiconductor layer 106. The first rare earth element has a first concentration in the first region 108 and has a second concentration in the second region 110. The concentration of the first rare earth element varies across the thickness of the rare earth pnictide buffer layer 104 in a graded, stepwise, linear, sublinear, or superlinear manner from the first concentration at the first region to the second concentration at the second region. Additionally, the second rare earth element has a third concentration in the first region 108 and a a second concentration in the second region 110. The concentration of the second rare earth element varies across the thickness of the rare earth pnictide buffer layer 104 in a graded, stepwise, linear, sublinear, or superlinear manner from the third concentration in the first region to a fourth concentration in the second region. The first concentration, the second concentration, the third concentration and the fourth concentration may vary from 0% to 100%. Accordingly, the first region 108 of the rare earth pnictide buffer layer 104 does not contain the second rare earth element, except for unintentional impurities, and the second region 110 of the rare earth pnictide layer 104 does not contain the first rare earth element, except for unintentional impurities. Change in concentration of the first rare element and the second rare earth element is introduced to gradually change the lattice constant from that of silicon to the second semi conductor layer being epitaxially grown over silicon without introducing any strain the layer.

The second semiconductor layer 106 may be a semiconductor from Group IV (e.g. germanium), a silicon-germanium alloy, or an alloy of a group III and a group V element (e.g. gallium arsenide). In some embodiments, the alloy of the group III and group V element may be doped or intrinsic. In some examples, the second semiconductor layer 106 does not contain nitrogen, except for unintentional impurities that may result from contamination and/or prior deposition processes. By providing a transition in lattice constant from the first semiconductor layer 102 to the second semiconductor layer 106, the rare earth pnictide buffer layer 104 allows for epitaxial growth of the second semiconductor layer 106 with minimal defect levels.

FIG. 2 depicts a layer structure 200 in which the rare earth pnictide buffer layer 104 includes multiple sublayers (212, 214, 216, 218). The layer structure 200 includes a first semiconductor layer 102, a first rare earth pnictide sublayer 212 epitaxially grown over the first semiconductor layer 102, and a second rare earth pnictide sublayer 214 epitaxially grown over the first rare earth pnictide sublayer 212 in the first region 108 of the rare earth pnictide buffer layer 104. The layer structure 200 further includes a second semiconductor layer 106, epitaxially grown over a fourth rare earth pnictide sublayer 218, which is epitaxially grown over a third rare earth pnictide sublayer 216 in the second region 110 of the rare earth pnictide buffer layer 104. The layer structure 200 is a particular example of the layer structure 100 shown in FIG. 1 and contains multiple sublayers in the rare earth pnictide buffer layer 104. In some embodiments, the sublayer 212 contains discrete RE-V alloys that are substantially lattice matched to the sublayer 214 to gradually modify the lattice structure of layer 200. In some embodiments, the consecutive layers may contain similar elements or different elements as described later in the present disclosure. While the first region 108 and the second region 110 are each depicted in FIG. 2 as including two sublayers, the regions 108 and 110 can include any number of additional sublayers in a multilayer structure. By providing a relatively smooth transition in lattice constant from the first semiconductor layer 102 to the second semiconductor layer 106, the rare earth pnictide buffer layer 104 allows for epitaxial growth of the second semiconductor layer 106 with minimal defect levels.

FIG. 3 depicts a layer structure 300 with multiple alternating layers of material 1 (layers 304, 308) and material 2 (layers 306, 310) epitaxially grown over semiconductor 1 (layers 302). In some embodiments, the lattice structures of material 1, material 2, and semiconductor 1 are different. The mismatch in lattice structures between any two layers (e.g. material 1 and material 2) induces a strain between the two layers. In some embodiments, a lattice mismatch of approximately 2-3% is tolerable, and a lattice mismatch of more than 3% results in a high level of defects in the layer structure 300. In some embodiments, the lattice matching is used to achieve a critical thickness of the second semiconductor layer 106. With thickness less than the critical thickness, the second semiconductor layer 106 is too thin to be useful. For example the thickness of Ge is 2 nm over Si and the mismatch between Si and Ge is 4%. As such, the materials chosen to be epitaxially grown over semiconductor 1 gradually modify the lattice constant of layer 300 and to reduce or minimize the strain on the layer structure 300.

In some embodiments, lattice strain induced by a layer 304 over layer 302 is represented as a product of layer thickness of layer 304 and a lattice mismatch between layer 304 and layer 302. Layer 304 may introduce a tensile or a compressive strain force on layer 302. Tensile and compressive strain forces are described in detail in relation to FIG. 5. Briefly, strain balancing may be achieved by using different materials to apply equal and opposite amount of strain force to balance each other out. As shown in the right diagram of FIG. 3, material 1 and material 2 induce opposite strain forces on semiconductor 1. Specifically, material 1 induces a tensile strain force 314 on the semiconductor 1, and material 2 induces a compressive strain force 316 on the semiconductor 1. In other embodiments, material 1 induces a compressive strain force and material 2 induces a tensile strain force. The forces depicted in FIG. 3 are representative and do not necessarily reflect the magnitude of the strain force induced by materials 1 and 2. In addition to the direction, the strain force may depend on the thickness of the layers of the materials. In particular, the layer 304 and the layer 306 are said to be strain balanced with respect to semiconductor 1 if:

$$(\Delta a1 * t1) = (\Delta a2 * t2) \qquad \text{EQ. 1}$$

where $\Delta a1$ represents the lattice mismatch of material 1 to semiconductor 1; t1 represents the thickness of the layer 304; $\Delta a2$ represents the lattice mismatch of material 2 to semiconductor 1; and t2 represents the thickness of the layer

306. If EQ. 1 holds, the layers 304 and 306 are strain balanced, such that the effects of these layers on the layer 302 cancel each other out. Accordingly, there is no resulting strain on the layer 302. This stack may be repeated with slight deviations in lattice structure while maintaining mechanical stability to transition the lattice constant of layer structure 300 from that of semiconductor 1 (302) to that of an alternate material to be deposited on structure 300.

Figure 4:
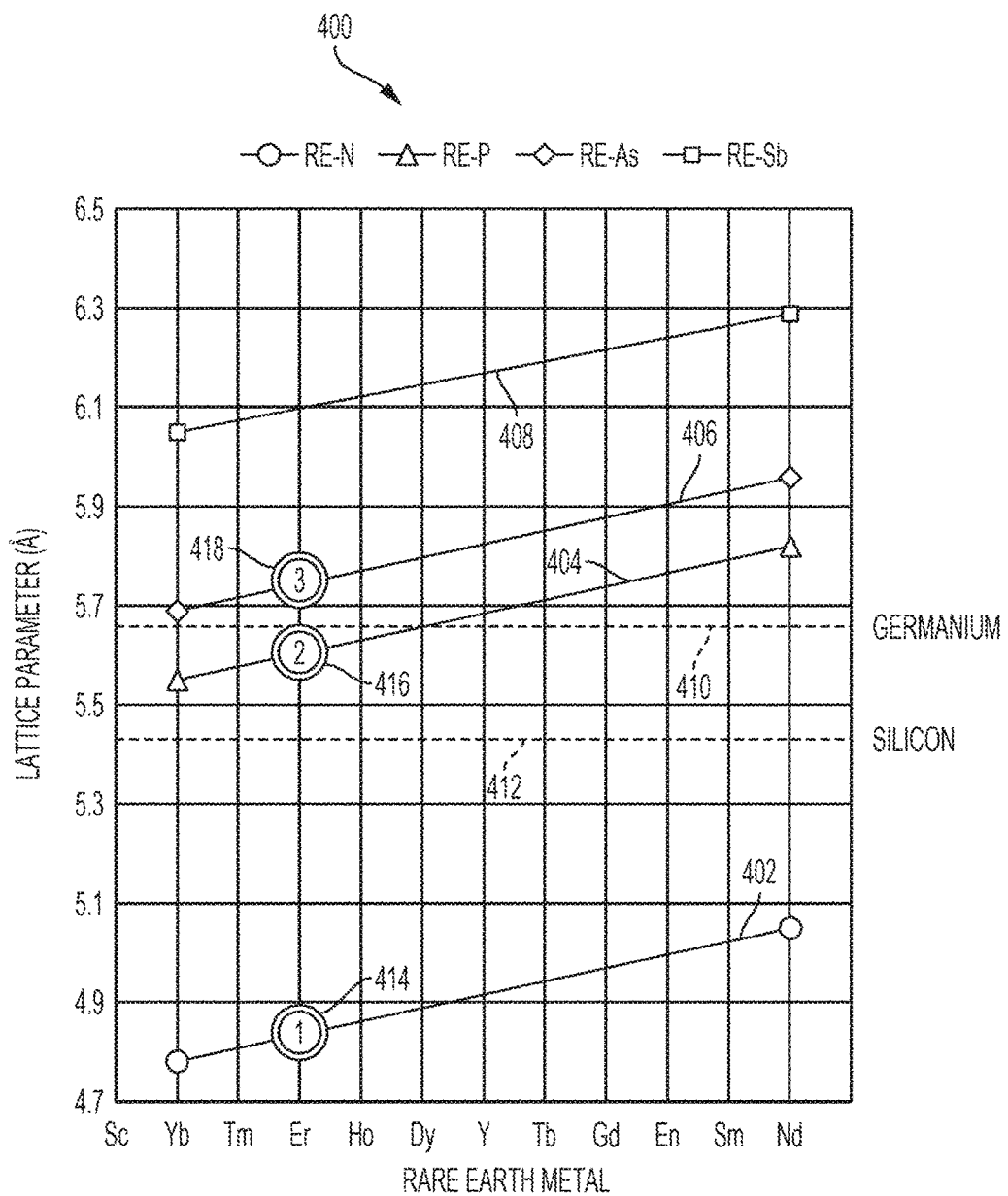
FIG. 4 depicts a graph that shows lattice constants of various materials that can be used in the layer structures described herein, according to an illustrative embodiment.

FIG. 4 depicts a graph 400 that shows lattice constants of various materials that can be used in the layer structures described herein. The x-axis shows the rare earth metals and the y-axis shows the lattice parameters measured in angstrom. The horizontal line 412 represents the lattice constant of silicon, and the horizontal line 410 represents the lattice constant of germanium. The curve 402 depicts the lattice constant for rare earth nitrides (RE-N) as a function of rare earth metals as depicted on the x-axis. Similar, the curve 404 depicts the lattice constant for rare earth phosphides (RE-P), the curve 406 depicts the lattice constant for rare earth arsenides (RE-As), and the curve 408 depicts the lattice constant for rare earth antimonides (RE-Sb). In one example, point 1 (414), depicts the lattice constant of rare earth metal erbium combined with nitrogen to form Erbium nitride (ErN). Point 2 (416) depicts the lattice constant of rare earth metal erbium combined with phosphorous to form Erbium phosphide (ErP), and point 3 (418) depicts the lattice constant of rare earth metal erbium combined with arsenic to form Erbium arsenide (ErAs). The lattice constant of ErN is approximately 4.8 Å which is lower than the lattice constants of ErP (approx. 5.6 Å) and ErAs (approx. 5.75 Å). The lattice constants of ErP and ErAs are relatively similar to the lattice constant of germanium (approx. 5.7 Å) and silicon (approx. 5.5 Å). In some embodiments, in order to epitaxially grow germanium on a silicon substrate, the rare earth pnictide buffer includes sublayers of ErN, ErP and ErAs of varying thicknesses to gradually modify the lattice constant of the layer from silicon to germanium without inducing a substantial amount of lattice strain as described below in relation to FIG. 5.

Figure 5:
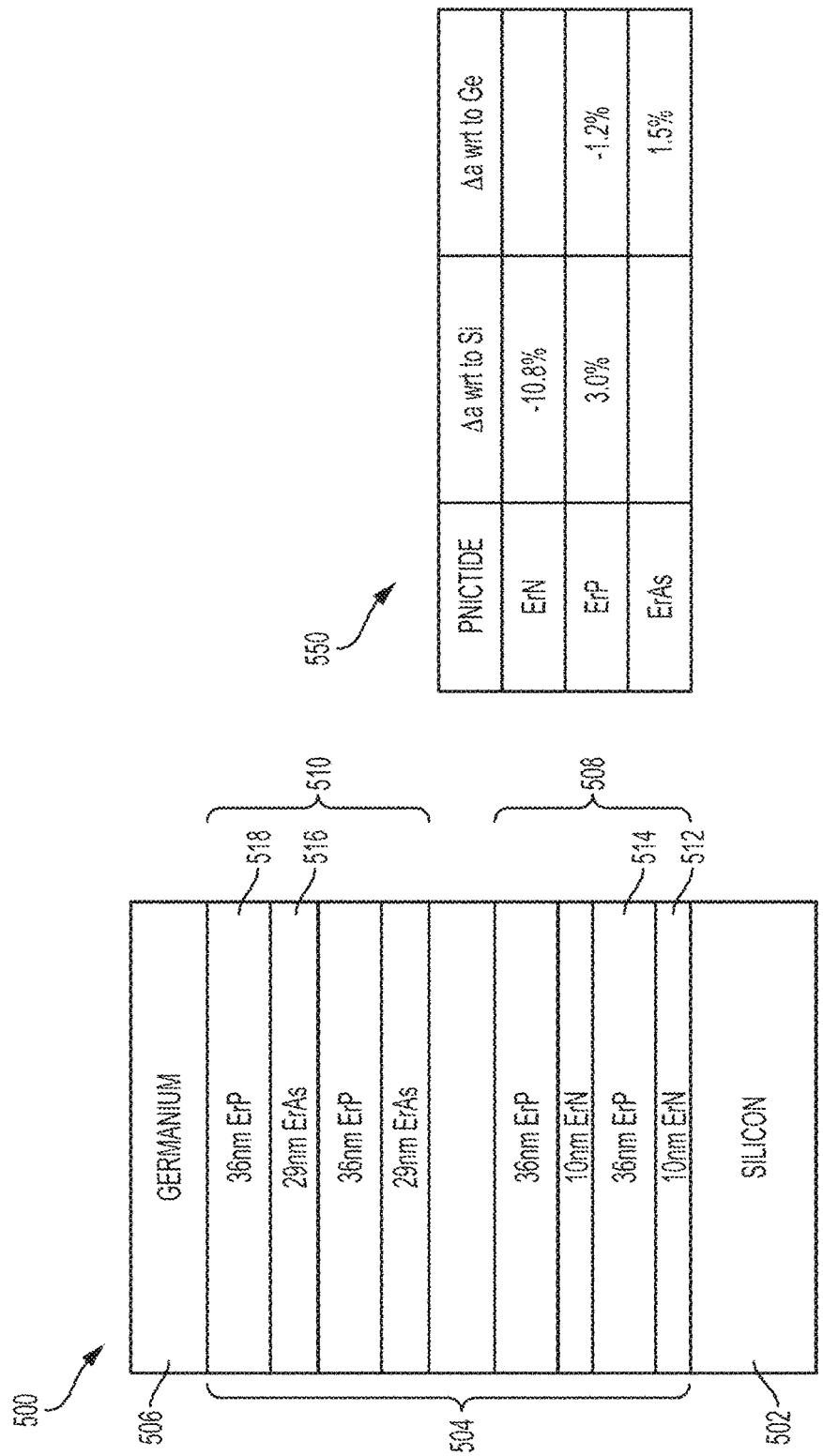
FIG. 5 depicts a layer structure that is a specific example of the layer structure shown in FIG. 2, according to an illustrative embodiment.

FIG. 5 is an exemplary depiction of a layer structure 500 where a layer of germanium 506 is epitaxially grown over silicon 502 using Er-(group V) alloys as part of the rare earth pnictide buffer 504. Table 550 in FIG. 5 includes the relative lattice mismatch (Δa) of ErN, ErP, and ErAs with respect to silicon (second column) and germanium (third column). As is shown in FIG. 4, the lattice constant of ErP and ErAs is close to the lattice constant of germanium. A combination of layers of ErN, ErP, and ErAs of varying thickness is used to gradually modify the lattice constant of layer structure 500 from the lattice constant of silicon to the lattice constant of germanium. As ErN has a lattice constant lower than that of silicon and ErP has a lattice constant higher than that of silicon, a combination of ErN and ErP is sufficient to generate an alloy that has a lattice constant close to the lattice constant of silicon 502. Gradually, while maintaining lattice stability, the concentration of ErN is reduced and the concentration ErAs is increased throughout the thickness of the rare earth pnictide buffer 504 to eventually achieve the same lattice constant as germanium 506 (or a lattice constant that is sufficiently near that of germanium 506). In region 508 close to the silicon substrate 502, the strain force exerted by ErN and ErP on silicon 502 may be used to determine the thickness of the two layers to be epitaxially grown over the silicon substrate. As ErP has a lattice constant lower than that of germanium and ErAs has a lattice constant higher than that of germanium, a combination of ErP and ErAs is sufficient to generate a layer with a lattice constant close to the lattice constant of germanium 506. In region 510 close to germanium 506, the strain force exerted by both ErAs and ErP on germanium is used to determine the thickness of the two layers over which germanium is epitaxially grown. Between regions 508 and 510, the concentration of ErN is gradually decreased and the concentration of ErAs is gradually increased in order to maintain the lattice stability of layer structure 500.

The values shown in the table 550 are estimates for exemplary purposes only. As shown in the table 550, ErN has a lattice mismatch of −10.8% with respect to silicon, and ErP has a lattice mismatch of +3.0% with respect to silicon. A negative mismatch indicates a tensile strain force exerted by ErN on the silicon substrate. The negative strain is introduced because the lattice constant of ErN is lower than the lattice constant of silicon (as shown in FIG. 4). When ErN is epitaxially grown over silicon, the atoms of Er and N occupy positions in the lattice structure of silicon. Because ErN has a smaller lattice constant than silicon, the atoms of Er and N are forced to occupy spots farther apart than the lattice constant of ErN indicates (e.g., at point 414 in FIG. 4, the lattice constant of ErN is approx. 4.8 Å and the lattice constant of silicon is approx. 5.5 Å), thus exerting a tensile strain force on the silicon substrate. A positive mismatch indicates a compressive strain force exerted by ErP on the silicon substrate. When ErP is epitaxially grown over silicon, the atoms of Er and P occupy positions on the lattice structure of silicon. Because ErP has a larger lattice constant than silicon, the atoms of Er and P are forced to occupy spots closer together than the lattice constant of ErP indicates, thus exerting a compressive strain force on the silicon substrate.

As is shown in FIG. 5, the thickness of one Er—V alloy is maintained at a constant thickness and the thickness of the other alloys are varied to match the lattice constants of germanium and silicon. In particular, the thickness of ErP (514, 518) is a fixed value throughout the buffer 504 (e.g., 36 nm). Table 550 in FIG. 5 also shows that the strain exerted by ErN on silicon (−10.8%) is more than triple the force exerted by ErP on silicon in the opposite direction (+3.0%). As the thickness of ErP is constant throughout the buffer 504, the thickness of the ErN layer 512 is 10 nm in order to reduce the strain on the silicon layer 502. Given that the values of the lattice constants of the two layers (512, 514) are known, and the thickness of layer 514 is known, the thickness of layer 512 can be calculated using EQ. 1. From EQ. 1, it may be deduced that the thickness of the ErN layer 512 is almost a third of the thickness of the ErP (514, 518) layer, to counter the higher strain force of the ErN layer 512. Similarly, in region 510 close to the germanium substrate 506, the thickness of ErAs 516 is computed using EQ. 1, given the thickness of ErP and the lattice constants of ErP and ErAs are known, to be 29 nm to reduce the strain on the germanium layer 506. The thickness of the ErAs layer 516 is similar to the thickness of the ErP layer (514, 518), as the strain force exerted by the ErP and ErAs is similar, but in opposite directions. In this way, the layer structure 500 has minimal dislocations and defects due to changes in lattice constant. By providing a transition in lattice constant from the silicon layer 502 to the germanium layer 506, the rare earth pnictide buffer layer 504 allows for epitaxial growth of the germanium layer 506 with reduced or minimal defect levels.

Figure 6:
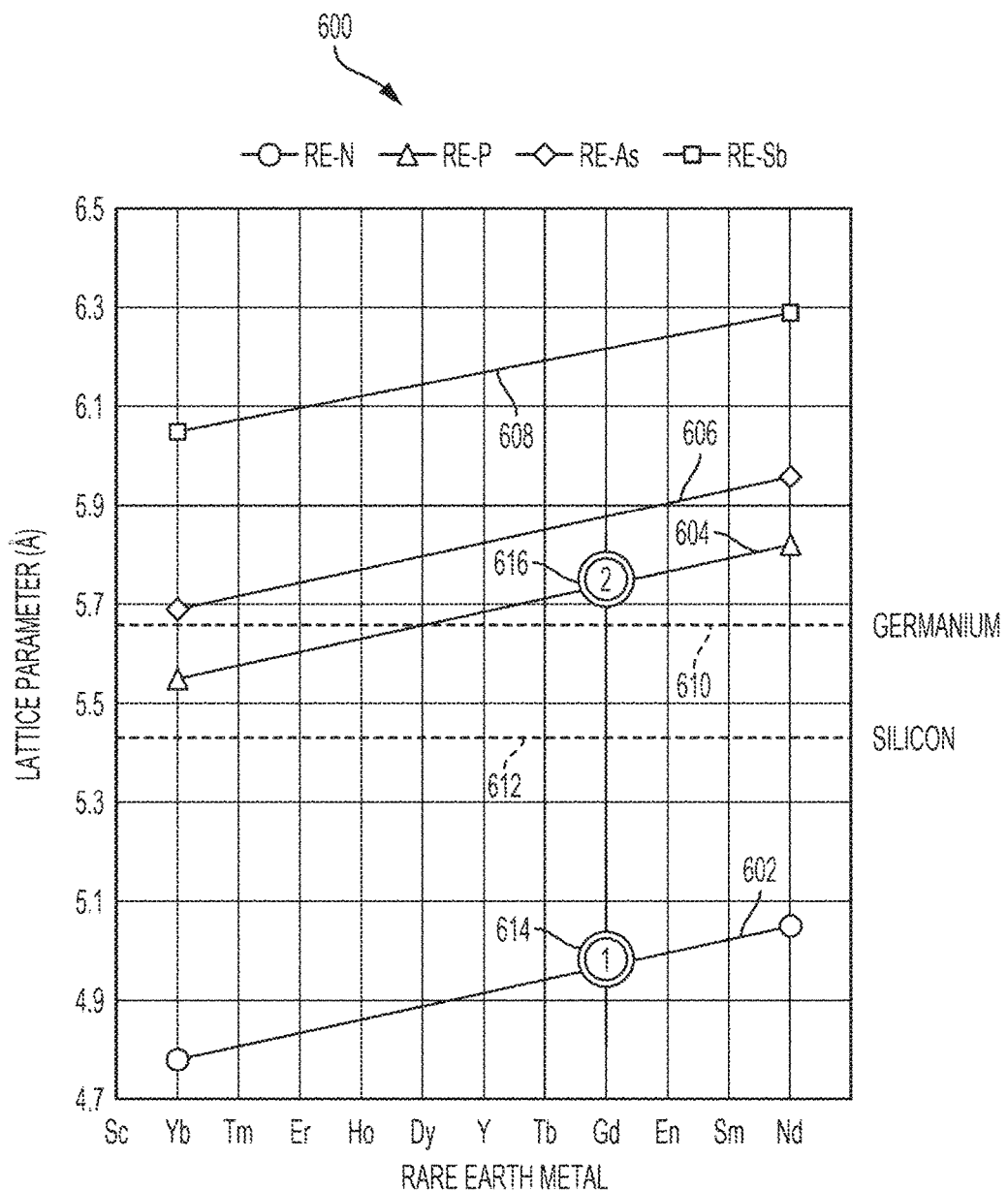
FIG. 6 depicts a graph that shows lattice constants of various materials that can be used in the layer structures described herein, according to an illustrative embodiment.

FIG. 6 depicts a graph 600 that shows lattice constants of various materials that can be used in the layer structures described herein. The graph 600 is similar to the graph 400 of FIG. 4, in which the x-axis shows the rare earth metals and the y-axis shows the lattice parameters measured in angstrom. The horizontal line 612 depicts the lattice constant of silicon, and the horizontal line 610 represents the lattice constant of germanium. The curve 602 represents the lattice constant for RE-N as a function of rare earth metals as depicted on the x-axis. Similarly, the curve 604 depicts the lattice constant for RE-P, the curve 606 depicts the lattice constant for RE-As, and the curve 608 depicts the lattice constant for RE-Sb. In one example, point 1 (614), depicts the lattice constant of rare earth metal gadolinium combined with nitrogen to form Gadolinium nitride (GdN). Point 2 (616) depicts the lattice constant of rare earth metal gadolinium combined with phosphorous to form Gadolinium phosphide (GdP). The lattice constant of GdN is approximately 4.8 Å which is much lower than the lattice constants of GdP (approx. 5.6 Å) and silicon (approx. 5.45 Å). The lattice constant of GdP (approx. 5.75 Å) is close to the lattice constant of germanium (approx. 5.7 Å). For example, in an example of epitaxially growing germanium over silicon, because the lattice constant of gadolinium phosphide is greater than the lattice constant of germanium and silicon, and the lattice constant of gadolinium nitride is less than the lattice constant of germanium and silicon, any combination of gadolinium nitride and gadolinium phosphide may be used to achieve the lattice constant of both silicon and germanium. In the region near the silicon substrate, there may be more gadolinium nitride than gadolinium phosphide and the concentration of gadolinium nitride may gradually decrease and the concentration of gadolinium phosphide may gradually increase in the rare earth pnictide buffer to reach a lattice constant relatively similar to the lattice constant of germanium so a stable layer of germanium may be epitaxially be grown over the rare earth pnictide buffer as described below in relation to FIG. 7.

Figure 7:
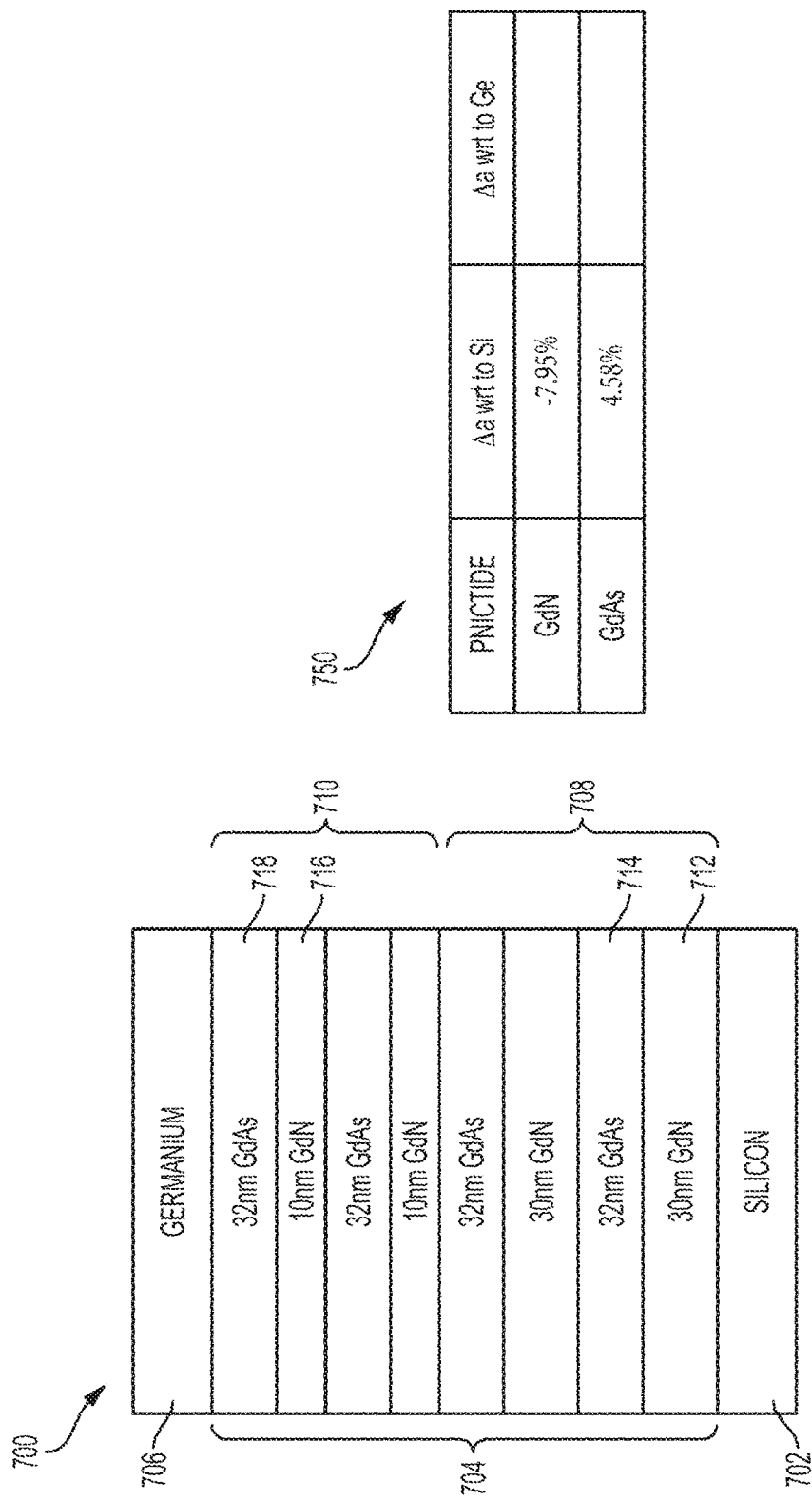
FIG. 7 depicts a layer structure that is a specific example of the layer structure shown in FIG. 5, according to an illustrative embodiment.

FIG. 7 is an exemplary depiction of layer structure 700 in which germanium 706 is epitaxially grown over silicon 702 using Gd-(group V) alloys as part of the rare earth pnictide buffer 704. Table 750 includes the relative lattice mismatch (Δa) of GdN and GdAs with respect to silicon (second column) and germanium (third column). A combination of layers of GdN and GdAs of varying thickness are used to gradually modify the lattice constant of layer 700 from the lattice constant of silicon to the lattice constant of germanium. A combination of GdN and GdAs is sufficient to generate an alloy that has a lattice constant close to the lattice constant of silicon 702 as is described below. Gradually, while maintaining lattice stability, the concentration of GdN is reduced and the concentration GdAs is increased throughout the rare earth pnictide buffer 704 to achieve the lattice constant of germanium 706. In region 708 close to the silicon substrate 702, the strain force exerted by both GdN and GdAs on silicon 702 are used to determine the thickness of the two layers to be epitaxially grown over the silicon substrate. Similarly, in region 710 close to germanium 706, the strain force exerted by both GdAs and GdN on germanium are used to determine the thickness of the two layers over which germanium is epitaxially grown.

As shown in FIG. 7, the concentration of GdN is gradually decreased and the concentration of GdAs is gradually increased through the thickness of of the rare earth pnictide buffer 704 in order to maintain the lattice stability of layer 700. In some embodiments, the concentration of reduction of GdN may result in the increase in the concentration of GdAs, and there may not need to be an increase in the concentration of GdAs. In some embodiments, there may be an actual increase in the concentration of GdAs resulting in a decrease in the concentration of GdN. In some embodiments, there may be an actual decrease in the concentration of GdN and an actual increase in the concentration of GdAs through the thickness of the rare earth pnictide buffer layer 704 of layer 700. The values shown in the table 750 are an estimate calculation for exemplary purposes only. As shown in the table 750, GdN has a lattice mismatch of −7.95% with respect to silicon and GdAs has a lattice mismatch of 4.58% with respect to silicon. A negative mismatch indicates a tensile strain force exerted by GdN on the silicon substrate. The negative strain is introduced because the lattice constant of GdN is lower than the lattice constant of silicon as shown in FIG. 6. When GdN is epitaxially grown over silicon, the atoms of Gd and N occupy positions in the lattice structure of silicon. Because GdN has a smaller lattice constant than silicon, the atoms of Gd and N will be forced to occupy spots farther apart than the lattice constant of GdN indicates, thus exerting a tensile strain force on the silicon substrate. A positive mismatch indicates a compressive strain force exerted by GdAs on the silicon substrate. When GdAs is epitaxially grown over silicon, the atoms of Gd and As occupy positions on the lattice structure of silicon. Because GdAs has a larger lattice constant than silicon, the atoms of Gd and As will be forced to be closer together than the lattice constant of GdAs indicates, thus exerting a compressive strain force on the silicon substrate.

In some embodiments, the thickness of one Gd—V alloy is maintained at a constant thickness and the thickness of the other alloys are varied to match the lattice constants of germanium and silicon. In this embodiment, the thickness of GdAs (714, 718) is maintained at a constant 32 nm as shown. Table 750 in FIG. 7 also shows that, the strain exerted by GdN on silicon is −7.95% which is more than 4.58%, the force exerted by GdAs on silicon in the opposite direction. As the thickness of GdAs is constant, the thickness of the GdN layer 712 is varied to 30 nm in order to reduce the strain on the silicon layer 702. The thickness of the GdN layer 712 is almost same as the thickness of the GdAs (714, 718) layer, to counter the strain force of the GdAs layer 714. Similarly, in region 710 close to the germanium substrate 506, the thickness of GdAs 716 is constant at 32 nm but the thickness of GdN is reduced to 10 nm to increase the concentration of GdAs near germanium 706 to match the lattice constant of germanium 706. In this way, the layer structure 700 has minimal dislocations and defects due to changes in lattice constant. By providing a transition in lattice constant from the silicon layer 702 to the germanium layer 706, the rare earth pnictide buffer layer 704 allows for epitaxial growth of the germanium layer 706 with minimal defect levels.

Figure 8:
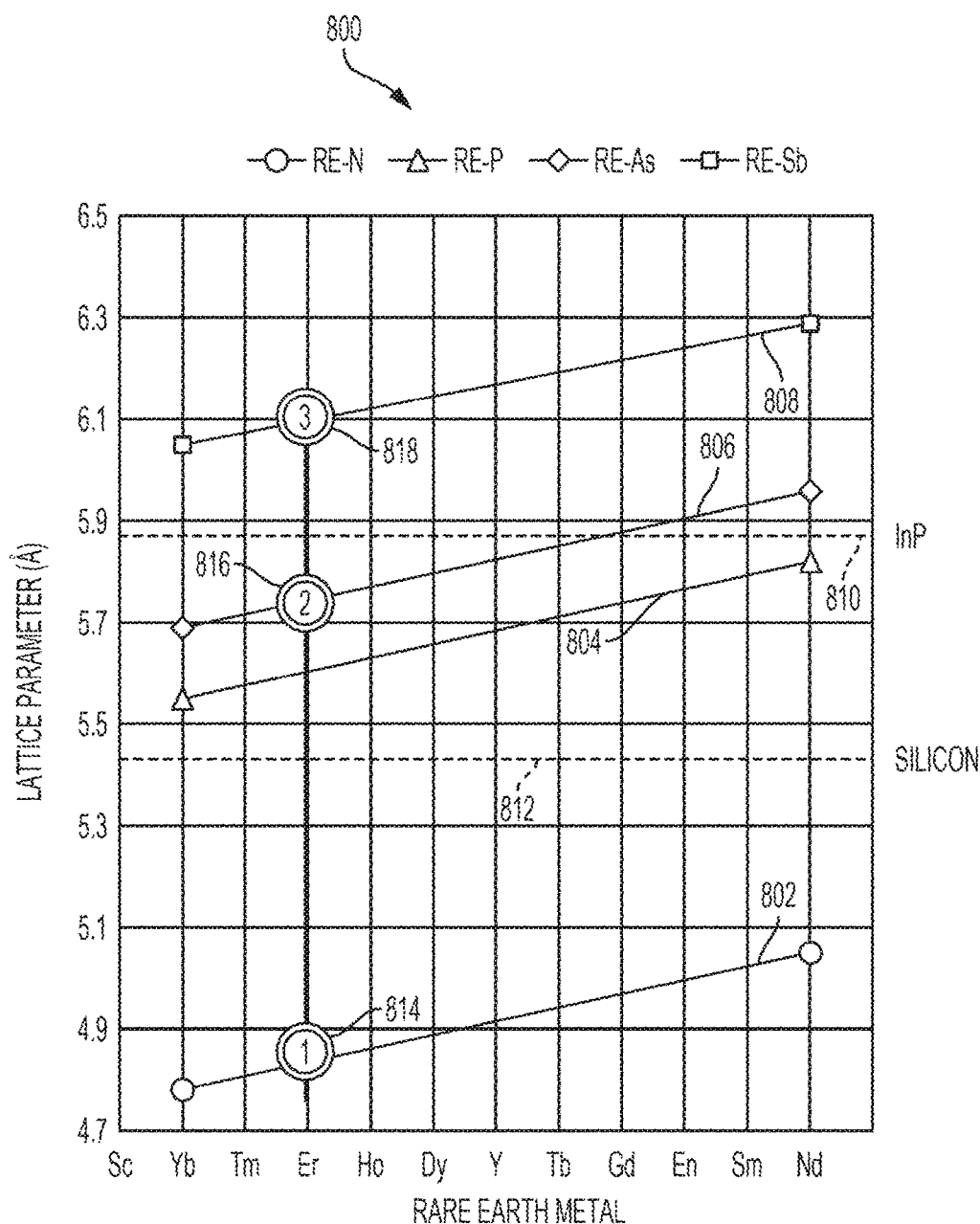
FIG. 8 depicts a graph that shows lattice constants of various materials that can be used in the layer structures described herein, according to an illustrative embodiment.

FIG. 8 depicts a graph 800 that shows lattice constants of various materials that can be used in the layer structures described herein. The x-axis shows the rare earth metals and the y-axis shows the lattice parameters measured in angstrom. The horizontal line 812 represents the lattice constant of silicon, and the horizontal line 810 represents the lattice constant of indium phosphide (InP), an III-V alloy that may be grown on a silicon substrate. The curve 802 depicts the lattice constant for rare earth nitrides (RE-N) as a function of rare earth metals as depicted on the x-axis. Similarly, the curve 804 depicts the lattice constant for rare earth phosphides (RE-P), the curve 806 depicts the lattice constant for rare earth arsenides (RE-As), and the curve 808 depicts the lattice constant for rare earth antimonides (RE-Sb). In one example, point 1 (814), depicts the lattice constant of rare earth metal erbium combined with nitrogen to form Erbium nitride (ErN). Point 2 (816) depicts the lattice constant of rare earth metal erbium combined with phosphorous to form Erbium arsenide (ErAs) and point 3 (818), depicts the lattice constant of rare earth metal erbium combined with arsenic to form Erbium antimonide (ErSb). The lattice constant of ErN is approximately 4.8 Å which is lower than the lattice constants of ErP (approx. 5.6 Å) and ErAs (approx. 5.75 Å). The lattice constants of ErP and ErAs are relatively similar to the lattice constant of InP (approx. 5.7 Å) and silicon (approx. 5.5 Å). In some embodiments, in order to epitaxially grow InP on a silicon substrate, the rare earth pnictide buffer includes multiple sublayers of ErN, ErP and ErAs of varying thicknesses to gradually modify the lattice constant of the layer from silicon to germanium without inducing a substantial amount of lattice strain. In some embodiments, a first sublayer of the rare earth pnictide buffer layer comprises ErN and ErAs to strain balance silicon, and a second sublayer of the rare earth pnictide buffer layer comprises ErAs and ErSb to strain balance InP as described below in relation to FIG. 15.

Figure 9:
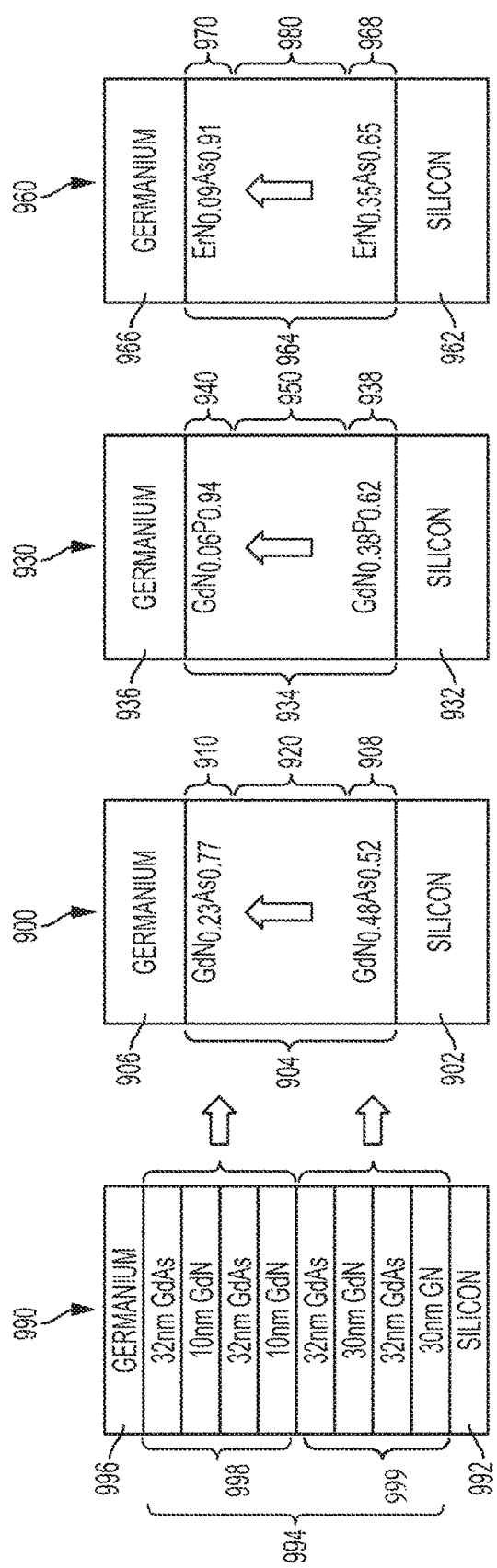
FIG. 9 depicts three layer structures that are a specific example of the layer structure shown in FIG. 7, according to an illustrative embodiment.

FIG. 9 depicts four layer structures 900, 930, 960, and 990 in which germanium is epitaxially grown over a rare earth pnictide buffer. In the layer structure 990, rare earth pnictide buffer 994 comprises pairs of binary alloys to gradually modify the lattice structure from silicon 992 to germanium 996. In the layer structure 900, rare earth pnictide buffers 904, 934, and 964 comprise a homogenous ternary alloy instead of different pairs of binary alloys as shown in layer structure 990. In some embodiments, it is possible to achieve the same affect of pairs of binary alloys in the rare earth pnictide buffer by introducing ternary alloys. The effect of rare earth pnictide buffer layer 994 may be achieved by creating two ternary alloys to replace sublayers 998 and 999 in the rare earth pnictide layer 994. The structural stability of layer 990 is carried into layer 900 as each sublayer of the rare earth pnictide buffer layer 994 (998 and 999) are structurally stable. The sublayers in rare earth pnictide buffer layer 994 are strain balanced to grow germanium layer 996 over silicon layer 902 with minimal structural defects. The ternary alloy compounds, 908 and 910 in rare earth pnictide buffer layer 904 of layer structure 900 are lattice matched to silicon layer 902 and germanium layer 906 respectively to maintain layer stability. The composition of the compound of ternary alloy is of the generic form $GdN_xAs_{1-x}$ ($0<x<1$). The concentration of the group V elements in the ternary alloy may be determined by determining the ratio of the thickness of the layer containing the group V element to the ratio of the entire layer.

For example, as shown in FIG. 9, in sublayer 999, GdN has a thickness of 30 nm and GdAs has a thickness of 32 nm. The proportion of GdN to the sum of a subset of sublayer 994 containing both GdN and GdAs in sublayer 994 may be calculated as:

$$x = \frac{30 \text{ nm}}{30 \text{ nm} + 32 \text{ nm}} = 0.48; \text{ and}$$
$$1 - x = 0.52$$

Even though this example sums only a portion of sublayer 994, the collection of GdN and GdAs is representative of the proportion of sublayer 994. Based on the calculations, the ternary alloy corresponding to sublayer 999 may be of the formula $GdN_{0.48}As_{0.52}$. Similarly, in sublayer 998, the proportion of GdN, to the sum of a subset of sublayer containing GdN and GdAs is calculated as:

$$x = \frac{10 \text{ nm}}{10 \text{ nm} + 32 \text{ nm}} = 0.23; \text{ and}$$
$$1 - x = 0.77$$

Even though this example sums only a portion of sublayer 998, the collection of GdN and GdAs is representative of the proportion of sublayer 994. Based on the calculations, the ternary alloy corresponding to sublayer 998 may be of the formula $GdN_{0.23}As_{0.77}$.

Layer structure 930 depicts a structure similar to the layer structure 900, but the ternary alloy comprises phosphorous instead of arsenic. In some embodiments, the composition of ternary alloy $GdN_{0.38}P_{0.62}$ in a first region 938 is lattice matched to silicon 932 to minimize the strain introduced in silicon. In a second region 940, the composition of ternary alloy $GdN_{0.06}P_{0.94}$ is lattice matched to germanium 936 to reduce the strain force introduced in germanium 936. The lattice constant of rare earth pnictide buffer layer 934 is gradually modified from the lattice constant of the first region 938 to the lattice constant of the second region 940 in the middle region 950 to maintain the structural strain balance of layer 930.

Layer structure 960 depicts a structure similar to the layer structure 900, but the ternary alloy comprises erbium instead of gadolinium. In some embodiments, the composition of ternary alloy is $ErN_{0.35}As_{0.65}$ in a first region 968 is lattice matched to silicon 962 to minimize the strain introduced in silicon. In a second region 970, the composition of ternary alloy is $ErN_{0.09}As_{0.91}$ in a first region 970 in order to lattice matched to germanium 966 to reduce the strain force introduced in germanium 966. The lattice constant of rare earth pnictide buffer layer 964 is gradually modified from the lattice constant off the first region 968 to the lattice constant of the second region 970 in the middle region 980 to maintain the structural strain balance of layer 960. By providing a transition in lattice constant from the silicon layers (e.g., layers 902, 932, 962, and 992) to the germanium layer (e.g., layers 906, 936, 966, and 996), the rare earth pnictide buffer layer (e.g., layers 904, 934, 964, and 994) allows for epitaxial growth of the germanium layer 506 with minimal defect levels.

Figure 10:
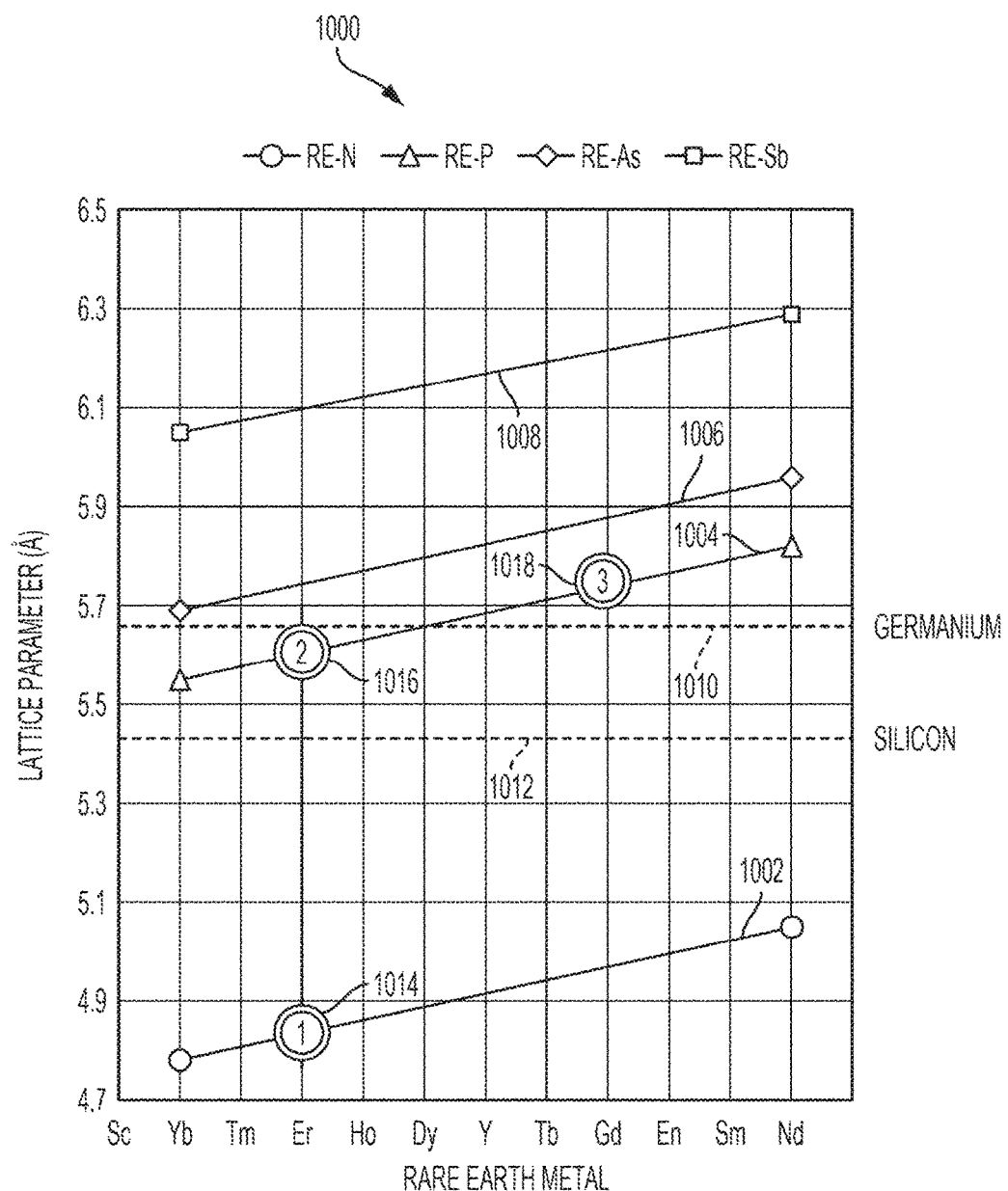
FIG. 10 depicts a graph that shows lattice constants of various materials that can be used in the layer structures described herein, according to an illustrative embodiment.

FIG. 10 depicts a graph 1000 that shows lattice constants of various materials that can be used in the layer structures described herein. The x-axis shows the rare earth metals and the y-axis shows the lattice parameters measured in angstrom. The graph 1000 includes curves 1002, 1004, 1006, 1008, 1010, and 1012, as well as intersection points 1014, 1016, and 1018. The horizontal line 1012 represents the lattice constant of silicon, and the curve 1010 represents the lattice constant of germanium. The horizontal line 1002 depicts the lattice constant for rare earth nitrides (RE-N) as a function of rare earth metals as depicted on the x-axis. Similarly, the curve 1004 depicts the lattice constant for rare earth phosphides (RE-P), the curve 1006 depicts the lattice constant for rare earth arsenides (RE-As), the curve 1008 depicts the lattice constant for rare earth antimonides (RE-Sb). In one example, point 1 (1014), depicts the lattice constant of rare earth metal erbium combined with nitrogen to form Erbium nitride (ErN). Point 2 (1016) depicts the lattice constant of rare earth metal erbium combined with phosphorous to form Erbium phosphide (ErP) and point 3 (1018) depicts the lattice constant of rare earth metal gadolinium combined with phosphorous to form Gadolinium phosphide (GdP). The lattice constant of ErN is approximately 4.8 Å which is much lower than the lattice constants of ErP (approx. 5.6 Å) and GdP (approx. 5.75 Å). The lattice constants of ErP and GdP are relatively similar to the lattice constant of germanium (approx. 5.7 Å) and silicon (approx. 5.5 Å). In some embodiments, in order to epitaxially grow germanium on a silicon substrate, the rare earth pnictide buffer includes sublayers of ErN, ErP and GdP of varying thicknesses to gradually modify the lattice constant of the layer from silicon to germanium without inducing a substantial amount of lattice strain as described below in relation to FIG. 15.

In some embodiments, instead of varying the concentration of the group V element to vary the lattice constant, it may be possible to vary the concentration of the rare earth elements to vary the lattice constant. As shown in FIG. 10, a set of binary pairs of ErN and ErP may be used to strain balance silicon as described in FIG. 5. This is because ErP has a lattice constant at point 2 1016 that is greater than the lattice constant of silicon and ErN has a lattice constant at point 1 1014 that is less than the lattice constant of germanium. A combination of these elements may be used to lattice match the lattice constant of silicon. A set of binary pairs of ErP and GdP may be used to strain balance germanium. This is because GdP has a lattice constant at point 3 1018 that is greater than the lattice constant of germanium and ErP has a lattice constant at point 2 1016 that is less than the lattice constant of germanium. A combination of these alloys may be used to lattice match the lattice constant of germanium.

Figure 11:
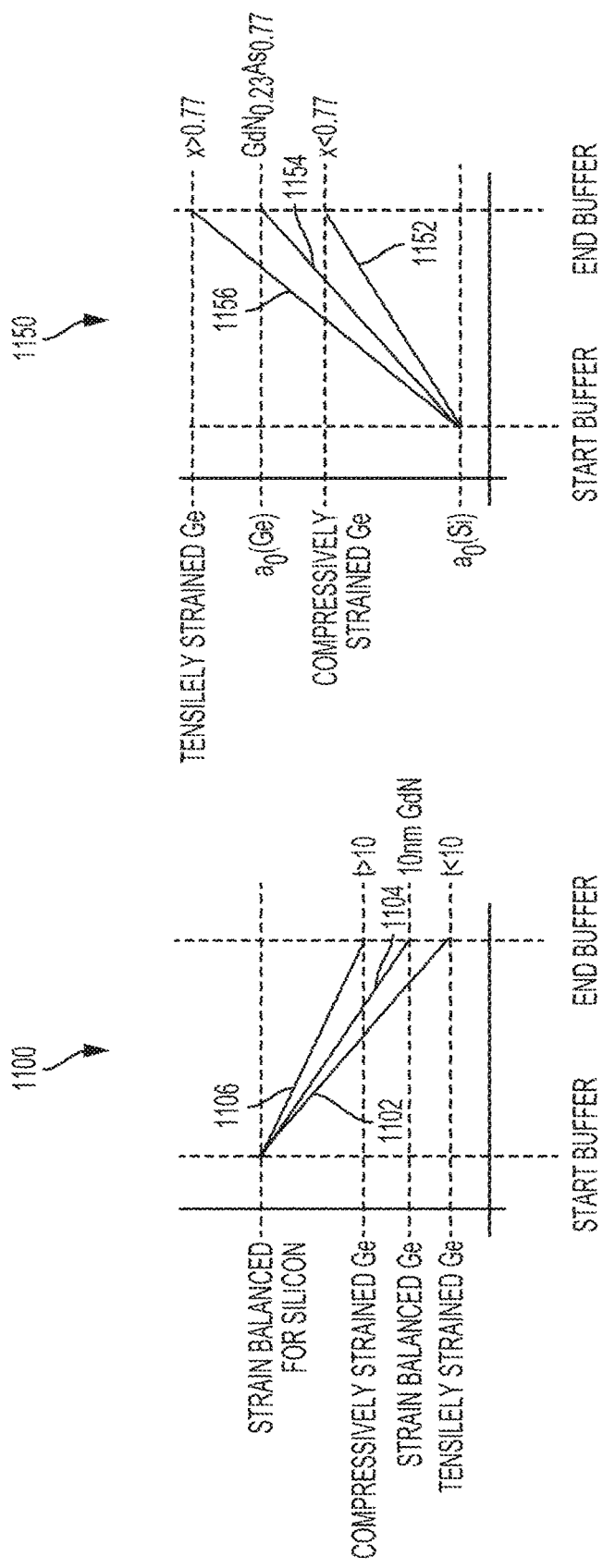
FIG. 11 depicts graphs that show the induction of strain in the second semiconductor layer 106; according to an illustrative embodiment.

FIG. 11 depicts graphs 1100 and 1150 to induce a desired strain in the second semiconductor layer 706 depicted in FIG. 7. In some embodiments, a desired strain is deliberately induced by creating a lattice mismatch to tailor properties (such as mobility of charge carriers and modifying the band gap to increase the efficiency of photon emissions for photonic devices) in the second semiconductor layer 706. In some embodiments, the lattice mismatch between semiconductor layer 706 and sublayer 718 is less than 1%. In some embodiments, a desired strain is created by a lattice mismatch of between 1%-3% between semiconductor layer 706 and sublayer 718 of rare earth pnictide buffer layer 704. In some embodiments, a lattice mismatch of less than 1% is preferred in order to maintain stability in layer structure 700. In some embodiments, a lattice mismatch between 1 and 3% is preferred to increase the mobility of charge carriers in semiconductor layer 706 or to modify the band gap value to increase the efficiency of emission of photons. Graph 1100 depicts a thickness (t) for the GdN sublayer 716 in the layer structure 700 and the resulting effect of the rare earth pnictide buffer layer 704 on the semiconductor layer 706 for a binary alloy. In the example layer structure depicted in FIG. 7, the binary rare earth pnictide alloy is GdN, but the same principles described herein can be applied to other rare earth pnictide buffer layers. Curve 1106 indicates that if the thickness t of the GdN sublayer 716 is greater than 10 nm, the GdN rare earth pnictide buffer layer exerts a net compressive strain force on the second semiconductor layer 706 (germanium, for example). Curve 1104 indicates that if the thickness of the GdN sublayer 716 is maintained at 10 nm, there is no net strain on the second semiconductor layer 706 (germanium, for example). Curve 1102 indicates that if the thickness of the GdN sublayer 716 is less than 10 nm, there is a net tensile strain force on the second semiconductor layer (germanium, for example).

Graph 1150 depicts the effect of composition of the region 910 on the semiconductor layer 906 for a ternary alloy. In this embodiment, the ternary rare earth pnictide alloy is $GdN_{1-x}As_x$. In case of the ternary alloy, the concentration of N and As in the region 910 is determined by the portion of N and As determined in the ternary alloy. Curve 1156 indicates that if the concentration of As (x) in the region 910 is greater than 0.77, the $GdN_xAs_{1-x}$ rare earth pnictide buffer layer exerts a net tensile strain force on the second semiconductor layer 902 (germanium, for example). Curve 1104 indicates that if the concentration of As in the region 910 is maintained at 0.77, there is no net strain on the second semiconductor layer 906 (germanium, for example). Curve 1152 indicates that if the concentration of As in the region 910 is less than 0.77, there is a net tensile compressive force on the second semiconductor layer 906 (germanium, for example). The selection of the alloys, depiction of graphs and the related numbers in this figure are for exemplary purposes only and the principle can be applied to other material combinations and layer structures.

Figure 12:
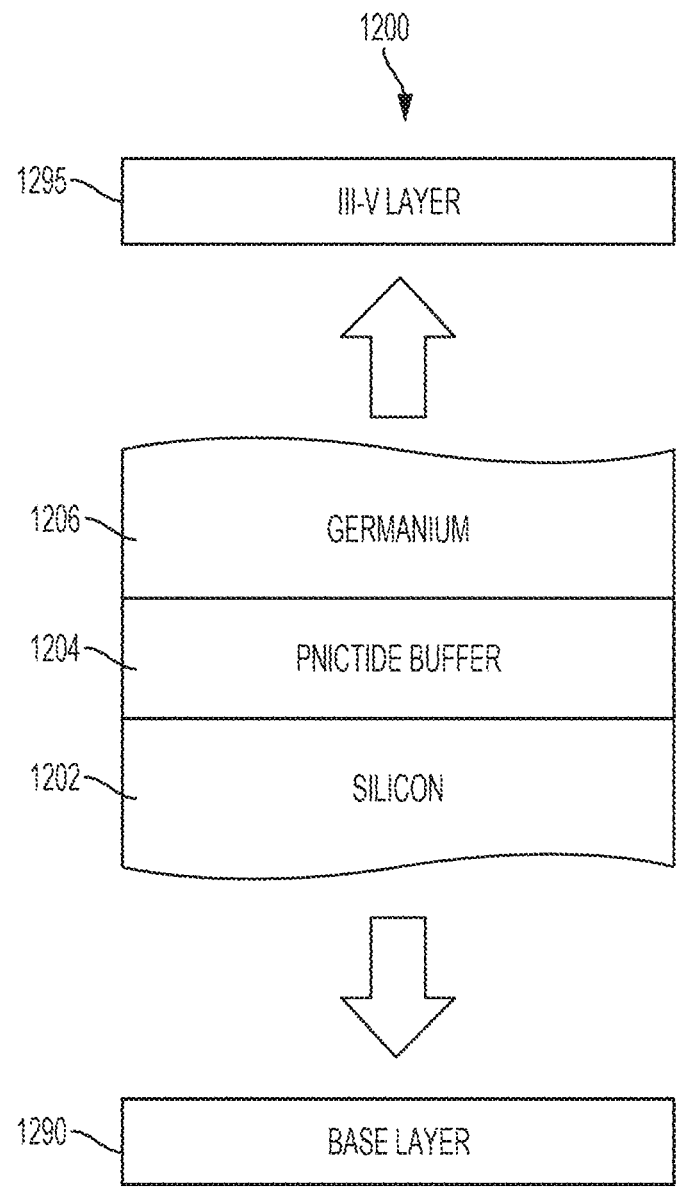
FIG. 12 depicts a layer structure that is a specific example of the layer structure shown in FIG. 1, according to an illustrative embodiment.

FIG. 12 depicts a layer structure 1200 with a base layer 1290 and III-V layer 1295. In some embodiments, there may be multiple components to this layer structure 1200. In some embodiments, one of the components of layer structure 1200 may be a sublayer similar to the layer 100 depicted in FIG. 1. Layer 100 comprises of a first semiconductor layer 102, a rare earth pnictide buffer layer 104 and a second semiconductor layer 106. Similarly, layer structure 1200 contains a silicon layer 1202, a pnictide buffer 1204 epitaxially grown over the silicon layer 1202, and a germanium layer 1206 epitaxially grown over the pnictide buffer layer 1204. The silicon-pnictide-germanium combination depicted in FIG. 12 is part of larger layer 1200. In some embodiments, the layer 1200 may contain different components below the silicon layer 1202 and above the vase layer 1290. In some embodiments, the layer 1200 may contain components above germanium 1206 and below III-V layer 1295.

Figure 13:
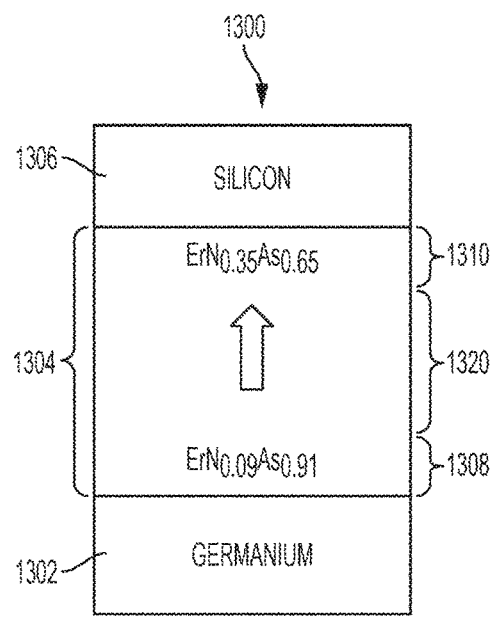
FIG. 13 depicts a layer structure that is a specific example of the layer structure shown in FIG. 9, according to an illustrative embodiment.

FIG. 13 depicts a layer structure 1300 with a silicon layer 1306 epitaxially grown over a rare earth pnictide buffer layer 1304, and the rare earth pnictide buffer layer 1304 epitaxially grown over germanium layer 1302. The layer 1300 is similar to layer 960 depicted in FIG. 9, except that in FIG. 13, the first semiconductor layer is germanium 1302 instead of silicon 962, and the second semiconductor layer is silicon 1306. As the first semiconductor layer and the second semiconductor layers have been switched relative to in FIG. 9, the composition grading of rare earth pnictide buffer 1304 is reversed from the composition grading of rare earth pnictide buffer 964 in FIG. 9. In order to maintain lattice stability, the region 1308 near germanium contains a higher concentration of arsenic (e.g., 0.91) and low concentration of nitrogen (e.g., 0.09), and the region 1310 near silicon contains a higher concentration of nitrogen (e.g., 0.35) and a lower concentration of arsenic (e.g., 0.65). The concentration of nitrogen and arsenic in region 1320 gradually varies from 0.09 to 0.35 for nitrogen and from 0.91 to 0.65 for arsenic, while maintaining lattice stability. By providing a gradual transition in lattice constant from the germanium layer 1302 to the silicon layer 1306, the rare earth pnictide buffer layer 1304 allows for epitaxial growth of the silicon layer 1306 on the germanium layer 1302 with minimal defect levels.

Figure 14:
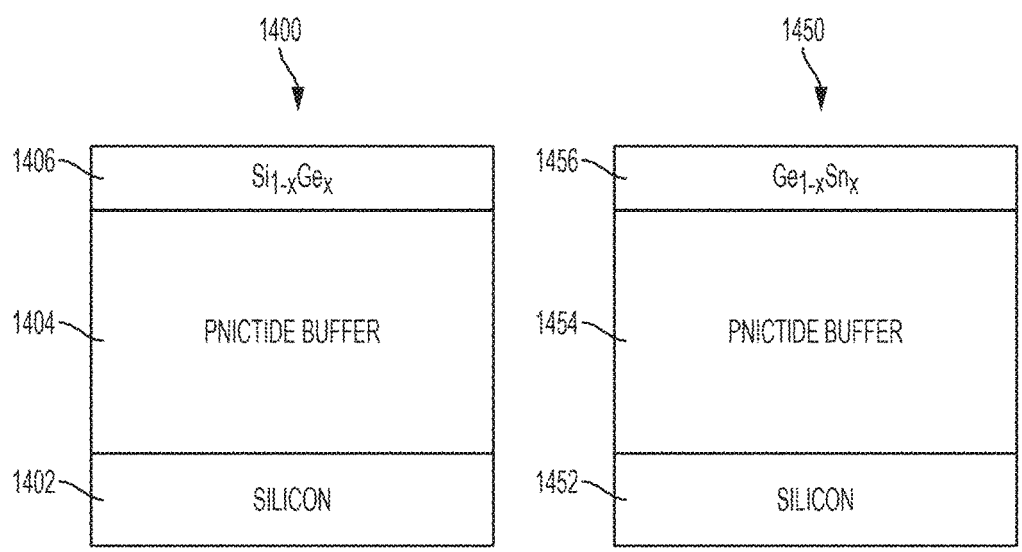
FIG. 14 depicts a layer structure that is a specific example of the layer structure shown in FIG. 1, according to an illustrative embodiment.

FIG. 14 depicts layer structures 1400 and 1450 where the second semiconductor layer 1402 is a group IV alloy. A group IV alloy contains different compositions of two or more element of group IV. In layer structure 1400, the second semiconductor layer 1406 is a silicon germanium alloy of the form $Si_{1-x}Ge_x$. The variable x ranges as $0<x\leq 1$. In some embodiments, the value of x is 1 and the group IV alloy in 1406 is composed entirely of germanium, except for unintentional impurities. In some embodiments, x is a value between 0 and 1, creating a group IV alloy containing silicon and germanium in layer 1406. In general, the value of x is not allowed to reach 0, as in that case the group IV alloy 1406 is composed entirely of silicon and there would be no different in the silicon substrate 1402 and the group IV alloy 1406. The composition of the pnictide buffer 1404 comprises relevant alloys to maintain the lattice stability of layer 1400 as described above.

In layer structure 1450, the second semiconductor layer 1456 is a germanium tin alloy of the form $Ge_{1-x}Sn_x$. The variable x ranges as $0 \le x \le 1$. In some embodiments, the value of x is 1, and the group IV alloy in 1456 is composed entirely of tin, except for unintentional impurities. In some embodiments, the value of x is 0, and the group IV alloy in 1456 is composed entirely of germanium, except for unintentional impurities. In some embodiments, x is a value between 0 and 1 creating a group IV alloy containing tin and germanium in layer 1456. The composition of the pnictide buffer 1454 comprises relevant alloys to maintain the lattice stability of layer 1450 as described above. By providing a transition in lattice constant from the silicon layer (1402, 1452) to the silicon-germanium or germanium-tin layers (1406, 1456), the rare earth pnictide buffer layers (1404, 1454) allows for epitaxial growth of the germanium layer 706 with minimal defect levels.

Figure 15:
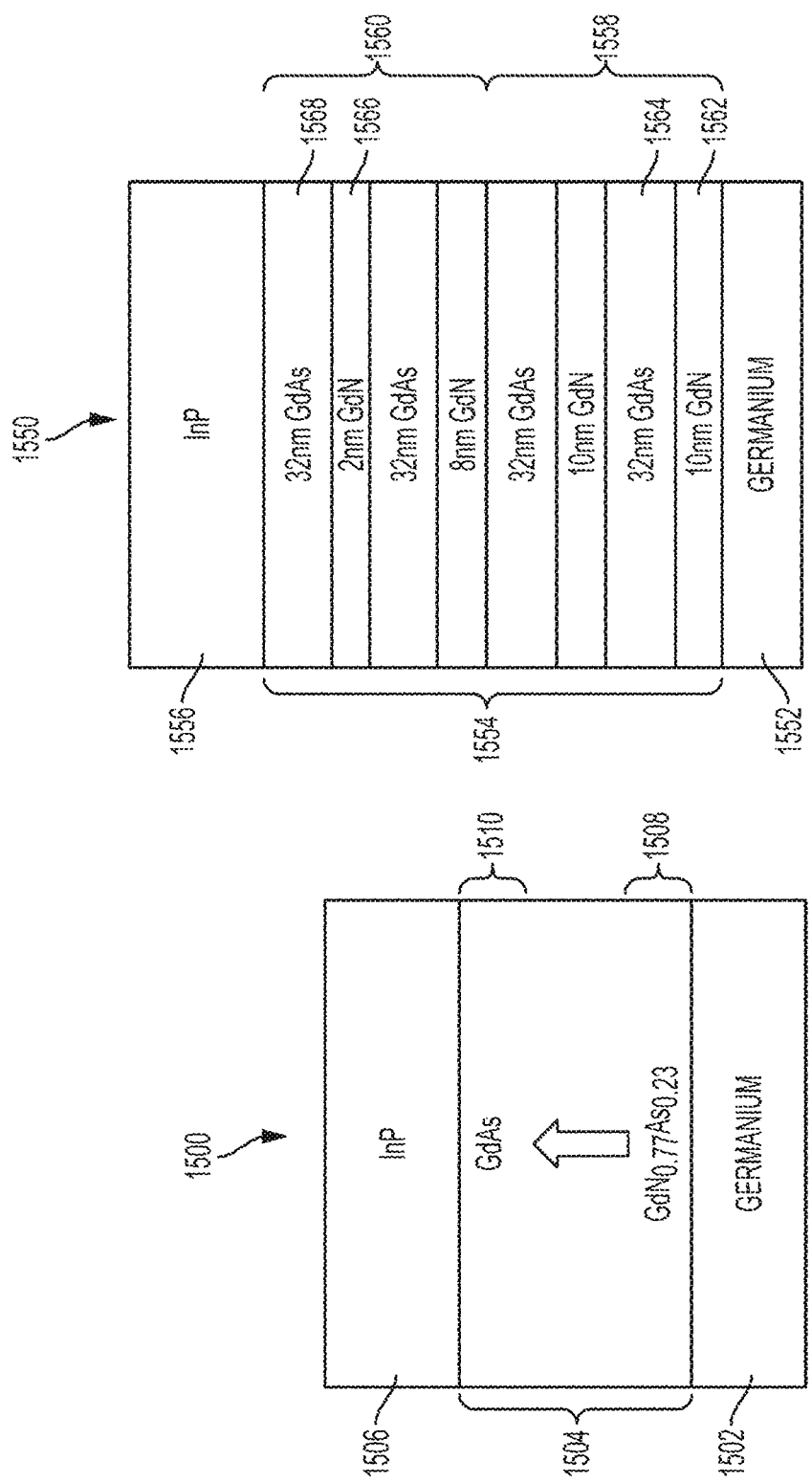
FIG. 15 depicts a layer structure that is a specific example of the layer structure shown in FIG. 9, according to an illustrative embodiment.

FIG. 15 depicts a layer structure 1500 with a second semiconductor layer of indium phosphide (InP) 1506 over a rare earth pnictide layer 1504 composed of a ternary alloy $GdN_{1-x}As_x$. The layer structure 1500 includes a first semiconductor layer of germanium 1502, a rare earth pnictide buffer layer 1504 epitaxially grown over the germanium layer 1502, and a InP layer 1506 epitaxially grown over the rare earth pnictide buffer layer 1504. In a first region 1508 close to the germanium layer 1502, the composition of the ternary alloy is approximately $GdN_{0.77}As_{0.23}$ in order to match the lattice composition of germanium layer 1502. In a region 1510 that is close to the InP layer, the composition of the rare earth pnictide layer 1504 is modified GdAs. The lattice constant of GdAs is similar to the lattice constant of InP, so the composition of the rare earth pnictide alloy is modified to match the lattice constant of InP. Layer structure 1550 includes a second semiconductor layer of indium phosphide (InP) 1506 over a rare earth pnictide layer 1504 composed of pairs of binary alloys of GdN and GdAs. The layer structure 1550 includes a first semiconductor layer of germanium 1552, a rare earth pnictide buffer layer 1554 epitaxially grown over the germanium layer 1552, and an InP layer 1556 epitaxially grown over the rare earth pnictide buffer layer 1504. The rare earth pnictide buffer layer in layer 1550 comprises pairs of binary alloys. The effect of the binary alloys in rare earth pnictide buffer 1554 is the same as the effect of the ternary alloy in rare earth pnictide buffer layer 1504. The thickness of the layers of GdN and GdAs are used to monitor the concentration of N and As in the rare earth pnictide buffer layer 1554 in order to lattice match with the InP 1556 and germanium 1552 layers. Throughout the thickness of the rare earth pnictide buffer layer 1554, the thickness of the layers of GdAs (1564, 1568) is kept at a constant 32 nm. In a first region 1558 near germanium 1552, the thickness of GdN 1564 is set at 10 nm to ensure that the first region of rare earth pnictide buffer 1558 is strain balanced with respect to germanium 1552. In a first region 1560 near InP 1556, the thickness of GdN 1566 is reduced to 2 nm to ensure that the second region of rare earth pnictide buffer 1560 is strain balanced with respect to InP 1556. The gradual decrease in the thickness of layers of GdN from 10 nm to 8 nm to 2 nm results in a increase in the concentration of GdAs in the second region 1560 near InP 1556. An example of the detailed calculations used to achieve the thickness of the layers is described in more detail in FIG. 5. By providing a transition in lattice constant from the germanium layers (1502, 1552) to the InP layers (1506, 1556), the rare earth pnictide buffer layers (1504, 1554) allows for epitaxial growth of the InP layers (1506, 1556) with minimal defect levels.

FIG. 16 depicts a layer structure 1600 that comprises a distributed Bragg reflector (DBR) structure for photonic device applications. The layer structure 1600 includes a silicon layer 1602, a number of rare earth pnictide layers, and a silicon germanium alloy or germanium-containing layer 1606. In some embodiments, the layer structure 1600 may include a different material for semiconductor layer 1602 in place of silicon, and the layer structure 1600 may include a different material for semiconductor layer 1606 instead of germanium or germanium alloy. In general, any combination of first and second semiconductors may be used in place of layers 1602 and 1606. The silicon layer 1602 can be any silicon layer that provides an epitaxial template for growth of the layer structure 1600. The silicon layer 1602 is, for example, a silicon substrate with a crystal orientation of <100>. However, the silicon layer 1602 can also be a silicon layer over an insulator layer, as in an SOI substrate, or can be a silicon layer epitaxially grown over another layer. The layer structure 1600 includes 2 pairs of rare earth pnictide layers 1612, 1614, that have the chemical formula GdN and GdAs respectively. Each of the pairs of GdN and GdAs quarter-wave layers (QWL) has a total thickness of $\lambda/4$, where $\lambda$ is the wavelength of the light which is to be reflected by the DBR structure. While the layer structure 1600 is depicted as including two pairs of rare earth pnictide layers, other numbers of pairs are contemplated, and the number of pairs is chosen to result in sufficient reflectance. A larger number of pairs will result in a higher reflectance.

FIG. 17 depicts a graph showing reflectivity of the distributed Bragg reflector of the layer structure 1600. FIG. 17 includes curves 1702, 1704, and 1706 which depict reflectivity of the DBR as a function of wavelength. The curve 1702 corresponds to a three-period reflector (i.e., a reflector with three pairs of QWL), the curve 1704 corresponds to a six-period reflector (i.e., a reflector with six pairs of QWL), and the curve 1702 corresponds to a nine-period reflector (i.e., a reflector with nine pairs of QWL). Increased numbers of periods in the DBR result in higher reflectance and sharper roll-off.

Figure 18:
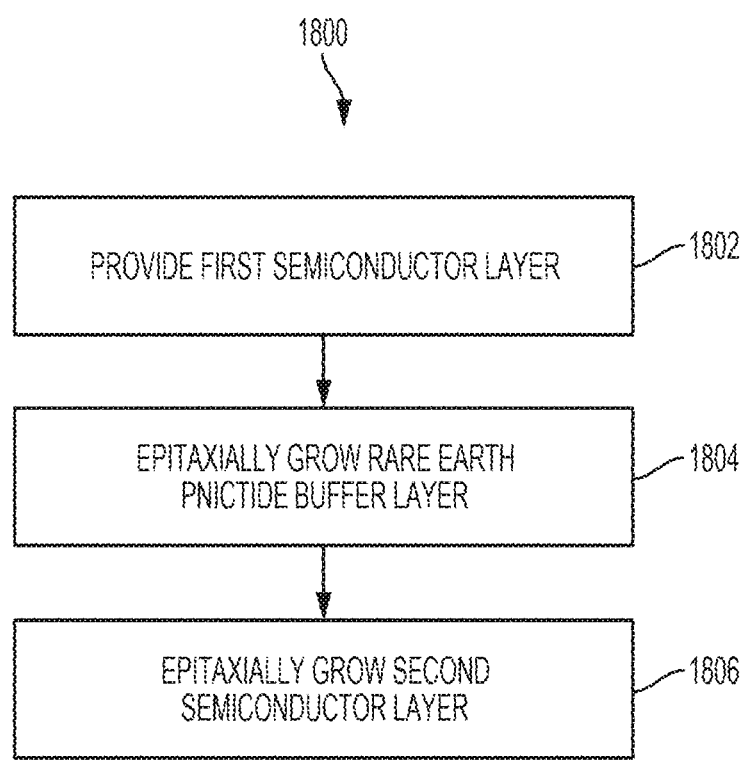
FIG. 18 depicts a flowchart of a method for growing the layer structure shown in FIG. 1, according to an illustrative embodiment.

FIG. 18 is a flowchart of a process 1800 for growing the layer structure 100, according to an illustrative embodiment. The process starts at 1802, when a first semiconductor layer is provided. At 1804, the process epitaxially grows rare earth pnictide buffer layer. At 1806, the process grows a second semiconductor layer 1806.

At 1802, the first semiconductor layer is provided. The first semiconductor 102 layer may be a silicon substrate over which the rare earth pnictide buffer layer 104 is grown. In some embodiments, the first semiconductor layer may be a germanium layer as described in FIG. 15.

At 1804, the rare earth pnictide buffer layer 104 is epitaxially grown over the first semiconductor layer 102. Examples of elements part of the rare earth pnictide buffer layer 104 include Er, Gd, In, N, P, and As, or any suitable combination hereof. The epitaxially grown rare earth pnictide buffer layer 104 is grown to modify the lattice constant of the layer 100 from the lattice constant of the first semiconductor to the lattice constant of the second layer while maintaining lattice stability throughout the rare earth pnictide buffer layer 104.

At 1806, a second semiconductor layer 106 is epitaxially grown over the rare earth pnictide buffer layer 104. In some embodiments, the second semiconductor 106 may be a III-V alloy, a group IV element, a group IV alloy, or any other suitable material.

Figure 19:
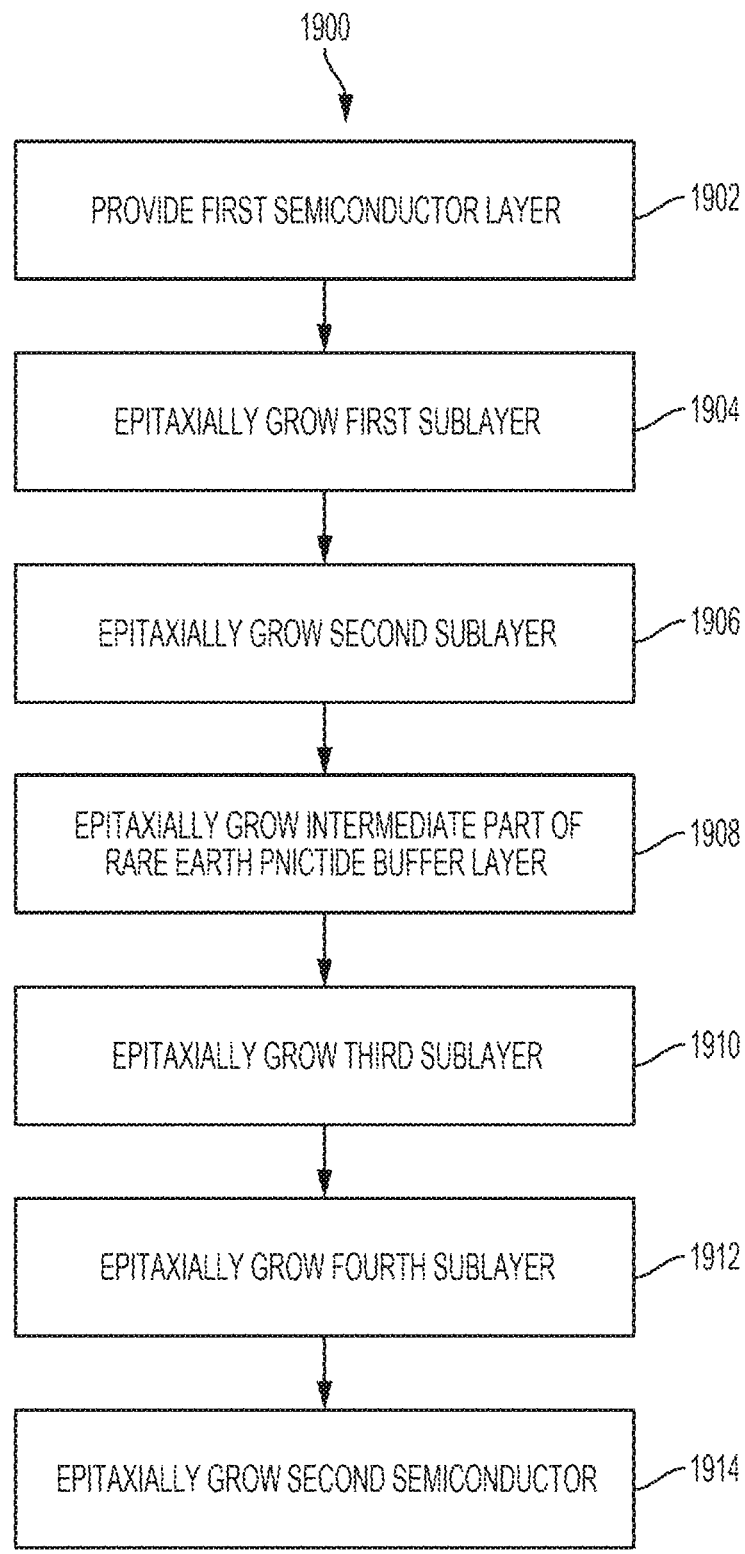
FIG. 19 depicts a flowchart of a method for growing the layer structure shown in FIG. 2, according to an illustrative embodiment.

FIG. 19 is a flowchart of a process 1900 growing the layer structure 200, according to an illustrative embodiment. The process starts at 1902, when a first semiconductor layer is provided. The process begins to epitaxially grow rare earth pnictide buffer layer. At 1904, the process epitaxially grows a first sublayer 212 on the first semiconductor layer 102. At 1906, the process grows a second sublayer 214 on the first sublayer 212. At 1910, the process epitaxially grows a third sublayer 216 on the intermediate part of the rare earth buffer. At 1912, the process epitaxially grows a fourth sublayer 218 on the third sublayer 216. At 1906, the process epitaxially grows a second semiconductor layer 102 over the fourth sublayer 218.

At 1902, the first semiconductor layer is provided. The first semiconductor 102 layer may be a silicon substrate over which the rare earth pnictide buffer layer 104 is grown. In some embodiments, the first semiconductor layer may be a germanium layer as described in FIG. 15.

At 1904, the first sublayer 212 of the rare earth pnictide buffer layer 104 is epitaxially grown over the first semiconductor layer 102. The first sublayer 212 is lattice matched to the lattice constant of the first semiconductor layer 102 and exerts a strain force in a particular direction on the first semiconductor layer 212.

At 1906, the second sublayer 214 of rare earth pnictide buffer layer 106 is epitaxially grown over the sublayer 212. The second sublayer 214 is lattice matched to the lattice constant of the first sublayer 214 and exerts a strain force in the opposite direction to the force exerted by the first sublayer 212.

At 1908, the intermediate buffer layer is epitaxially grown over the sublayer 214. One region of the intermediate buffer layer has a first lattice constant close to the lattice constant of sublayer 214 and a second region of the intermediate buffer layer has a second lattice constant close to the lattice constant of layer 216. In some embodiments the lattice constant of the intermediate buffer layer is gradually modified from the first lattice constant to the second lattice constant. In some embodiments, the intermediate buffer layer comprises other sublayers not shown in FIG. 2. This is described in detail in relation to FIG. 7. In some embodiments, the intermediate buffer layer comprises a ternary alloy composed of various concentrations of rare earth and group V alloys, as is described in detail in relation to FIG. 9.

At 1910, third sublayer 216 of rare earth pnictide buffer layer 106 is epitaxially grown over the intermediate buffer layer. The third sublayer 216 is lattice matched to the lattice constant of the intermediate buffer and exerts a strain force in a first direction on the second semiconductor layer 102.

At 1912, fourth sublayer 218 of rare earth pnictide buffer layer 106 is epitaxially grown over the intermediate buffer layer. The fourth sublayer 214 is lattice matched to the lattice constant of the intermediate buffer layer and exerts a strain force in a second direction opposite to the first direction on the second semiconductor layer 102.

Examples of elements part of the various sublayers of the rare earth pnictide buffer layer 104 are Er, Gd, In, N, P, and As.

At 1914, the second semiconductor layer 102 is epitaxially grown over the sublayer 218. The second semiconductor layer 102 is lattice matched to the lattice constant of the first sublayer 218. In some embodiments, the second semiconductor 106 may be a III-V alloy, a group IV element, a group IV alloy, or any other suitable material.

Various changes and modifications to the embodiments herein chosen for purposes of illustration will readily occur to those skilled in the art. To the extent that such modifications and variations do not depart from the spirit of the invention, they are intended to be included within the scope thereof.

A lattice constant, or lattice parameter or lattice spacing, refers to the physical dimension of unit cells in crystal lattice. Lattice constants are typically on the order of several angstroms (Å). Matching lattice constants between semiconductor materials allows layers to be grown without a change in crystal structure.

Group V elements are the elements belonging to group V (as used in semiconductor physics) of the periodic table. Group V is understood in the field to include nitrogen (N), phosphorous (P), arsenic (As), antimony (Sb), and bismuth (Bi). This group of elements is understood to be the same group referred to as, for example, Group 15 in modern IUPAC notation, the nitrogen family, or pnictogens.

The lanthanide series includes the metals cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Throughout this disclosure it should be understood that the term rare-earth elements or rare-earth metals includes scandium and yttrium, as well as all lanthanides.

The growth and/or deposition described herein can be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

III-nitride (III-N) materials are semiconducting materials comprising nitrogen and one or more Group III elements. Common Group III elements used to form III-nitride materials include aluminum, gallium, and indium. III-nitride materials have large direct band gaps, making them useful for high-voltage devices, radio-frequency devices, and optical devices. Furthermore, because multiple Group III elements can be combined in a single III-nitride film in varying compositions, the properties of III-nitride films are highly tunable.

In some embodiments, the III-V and III-nitride materials used in the layer structures described herein are grown using metal-organic chemical vapor deposition (MOCVD). In MOCVD, one or more Group III precursors react with a Group V precursor to deposit a III-nitride film on a substrate. Some Group III precursors include trimethylgallium (TMGa) as a gallium source, trimethylaluminum (TMA) as an aluminum source, and trimethylindium (TMI) as an indium source. Ammonia is a Group V precursor which can be used as a nitrogen source. Tert-butylarsine and arsine are Group V precursors which can be used as arsenic sources. Tert-butylphosphine and phosphine are Group V precursors which can be used as phosphorous sources.

In some embodiments, the III-V and III-nitride materials used in the layer structures described herein are grown using molecular beam epitaxy (MBE). MBE is an epitaxy method for thin-film deposition of single crystals that takes place in high or ultra-high vacuum. In MBE, precise beams of gaseous atoms or molecules are fired at a heated substrate.

When the molecules land on the substrate's surface, they condense and build up slowly and systematically in ultra-thin layers.

As described herein, a layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy). A layer structure means a set of layers, and can be a stand-alone structure or part of a larger structure. A III-nitride structure means a structure containing III-nitride material, and can contain additional materials other than III-nitrides, a few examples of which are Si, a silicon oxide ($SiO_x$), silicon nitride ($Si_xN_y$) and III-V materials. Likewise, a III-V structure means a structure containing III-V material, and can contain additional materials other than III-Vs, a few examples of which are Si, a silicon oxide ($SiO_x$), silicon nitride ($Si_xN_y$) and III-nitride materials (a subset of III-Vs).

"Monolithically-integrated" means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in direct contact with the substrate; or (2) the material is in contact with one or more transitional layers that reside on the substrate.

Single-crystal means a crystal structure that comprises substantially only one type of unit-cell. A single-crystal layer, however, may exhibit some crystal defects such as stacking faults, dislocations, or other commonly occurring crystal defects.

Single-domain (or monocrystal) means a crystalline structure that comprises substantially only one structure of unit-cell and substantially only one orientation of that unit cell. In other words, a single-domain crystal exhibits no twinning or anti-phase domains.

Single-phase means a crystal structure that is both single-crystal and single-domain.

Crystalline means a crystal structure that is substantially single-crystal and substantially single-domain. Crystallinity means the degree to which a crystal structure is single-crystal and single-domain. A highly crystalline structure would be almost entirely, or entirely single-crystal and single-domain.

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of the crystalline layer. The crystalline layer can be, in some examples, lattice matched or lattice coincident. A lattice matched crystalline layer can have the same or a very similar lattice spacing as the top surface of the crystalline substrate. A lattice coincident crystalline layer can have a lattice spacing that is an integer multiple, or very similar to an integer multiple, of the lattice spacing of the crystalline substrate. In some embodiments, an number may be considered an integer if it is within 0.5% of an integer. For example, numbers between 1.95 and 2.05 may be considered the integer 2. In some embodiments, the lattice spacing in lattice matched crystalline structures may be approximately 0.1%, 0.2%, 0.3%, 0.4%, 0.5%, or any other suitable percentage. In general, the lattice spacing in lattice matched crystalline structures may be less than 1%. Alternatively, the lattice spacing of the crystalline substrate can be an integer multiple, or very similar to an integer multiple, of the lattice spacing of the lattice coincident crystalline layer. The quality of the epitaxy is based in part on the degree of crystallinity of the crystalline layer. Practically, a high quality epitaxial layer will be a single crystal with minimal defects and few or no grain boundaries.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, gallium nitride, silicon carbide, gallium oxide, germanium, alumina, gallium-arsenide, indium-phosphide, silica, silicon dioxide, borosilicate glass, pyrex, and sapphire.

A rare earth pnictide material is a material that contains one or more group V elements and one, two, or more rare earth (RE) elements. The rare earth elements include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y).

Semiconductor-on-Insulator means a composition that comprises a single-crystal semiconductor layer, a single-phase dielectric layer, and a substrate, wherein the dielectric layer is interposed between the semiconductor layer and the substrate. This structure may include silicon-on-insulator ("SOI") compositions.

Carrier concentration means the number of majority carriers per unit volume.

Charge carrier density denotes the number of charge carriers per volume.

Interface means the surface between two layers or regions of dissimilar crystalline semiconductors.

Semiconductor-on-insulator compositions include but are not limited to a silicon, germanium, or silicon-germanium "active" layer. In other words, exemplary semiconductor-on-insulator compositions include, without limitation: silicon-on-insulator, germanium-on-insulator, and silicon-germanium-on-insulator. In some embodiments, various structures of silicon that may be used are Si<100>, Si<110>, Si<111>, for example.

A first layer described and/or depicted herein as "on" or "over" a second layer can be immediately adjacent to the second layer, or one or more intervening layers can be between the first and second layers. An intervening layer described and/or depicted as "between" first and second layers can be immediately adjacent to the first and/or the second layers, or one or more additional intervening layers may be between the intervening layer and the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results. Additionally, the different examples described are not singular examples and features from one example may be included within the other disclosed examples. Accordingly, it will be understood that the claims are not to be limited to the examples disclosed herein, but is to be understood from the technical teachings provided above, as those teachings will inform the person of skill in the art.

The invention claimed is:

1. A layer structure, comprising:
a first semiconductor layer with a first lattice constant;
a rare earth pnictide buffer epitaxially grown over the first semiconductor, wherein a first region of the rare earth pnictide buffer adjacent to the first semiconductor has a first net strain that is less than 1%;
a second semiconductor layer epitaxially grown over the rare earth pnictide buffer, wherein a second region of the rare earth pnictide buffer adjacent to the second semiconductor has a second net strain that is a desired strain;
wherein the rare earth pnictide buffer comprises:
one or more rare earth elements, and
one or more Group V elements.

2. The layer structure of claim 1, wherein the desired strain is less than 1%.

3. The layer structure of claim 1, wherein the first region of the rare earth pnictide buffer comprises:
a first sublayer comprising a first rare earth pnictide alloy and having a first thickness;
a second sublayer comprising a second rare earth pnictide alloy and having a second thickness;
wherein the ratio of the first thickness to the second thickness results in the first net strain of the first region being less than 1%.

4. The layer structure of claim 3, wherein the second region of the rare earth pnictide buffer comprises:
a third sublayer comprising a third rare earth pnictide alloy and having a third thickness;
a fourth sublayer comprising the second rare earth pnictide alloy and having the second thickness;
wherein the ratio of the third thickness to the second thickness results in the second net strain of the second region being the desired strain.

5. The layer structure of claim 4, wherein the desired strain is between 1% and 3%.

6. The layer structure of claim 4, wherein the first, second, and third rare earth pnictide alloys comprise a common rare earth element.

7. The layer structure of claim 6, wherein:
the first rare earth pnictide alloy comprises ErN;
the second rare earth pnictide alloy comprises ErP; and
the third rare earth pnictide alloy comprises ErAs.

8. The layer structure of claim 6, wherein:
the first rare earth pnictide alloy comprises GdN;
the second rare earth pnictide alloy comprises GdAs; and
the third rare earth pnictide alloy comprises GdN.

9. The layer structure of claim 4, wherein:
the first rare earth pnictide alloy comprises ErN;
the second rare earth pnictide alloy comprises ErP; and
the third rare earth pnictide alloy comprises GdP.

10. The layer structure of claim 1, wherein the first semiconductor comprises Si and the second semiconductor comprises of $Si_{1-x}Ge_x$ ($0<x\le1$).

11. The layer structure of claim 1, wherein the first semiconductor comprises Si and the second semiconductor comprises one or more of $In_xGa_{1-x}As_yP_{1-y}$ and $Al_xGa_{1-x}As$ ($0\le x, y\le 1$).

12. The layer structure of claim 1, wherein:
the first region of the rare earth pnictide buffer comprises a first rare earth pnictide alloy with elements in first proportions; and
the second region of the rare earth pnictide buffer comprises the first rare earth pnictide alloy with elements in second proportions.

13. The layer structure of claim 3, wherein the second region of the rare earth pnictide buffer comprises a third rare earth pnictide alloy with elements in third proportions, wherein the third proportions result in the second net strain of the second region being the desired strain.

14. The layer structure of claim 1, wherein:
the first semiconductor layer is epitaxially grown over a base material; and
an upper semiconductor layer is epitaxially grown over the second semiconductor layer.

15. The layer structure of claim 4, wherein the second and the third thicknesses are chosen to result in Bragg reflection of light of a desired wavelength.

16. The layer structure of claim 1, wherein any of the first semiconductor layer or the second semiconductor layer is composed of any of Si, GaAs and InP.

17. The layer structure of claim 1, wherein the rare earth pnictide buffer comprises a first rare earth pnictide sublayer having a first lattice constant and a first thickness, and a second rare earth pnictide sublayer grown having a second lattice constant greater than the first lattice constant, and a second thickness, and
wherein the first rare earth pnictide sublayer is composed of a first rare earth pnictide, and the second rare earth pnictide sublayer is composed of a second rare earth pnictide.

18. The layer structure of claim 17, wherein the first rare earth pnictide sublayer the second rare earth pnictide sublayer further include a same Group V element.

19. The layer structure of claim 17, wherein the first thickness of the first rare earth pnictide sublayer and the second thickness of the second rare earth pnictide are selected in a manner such that a first layer strain between the first semiconductor layer and the first rare earth pnictide sublayer and a second layer strain between the second semiconductor layer and the second rare earth pnictide sublayer are balanced.

* * * * *